(12) United States Patent
Murphy

(10) Patent No.: US 11,201,627 B2
(45) Date of Patent: Dec. 14, 2021

(54) SPECTRALLY EFFICIENT DIGITAL LOGIC (SEDL) DIGITAL TO ANALOG CONVERTER (DAC)

(71) Applicant: Massachusetts Institute of Technology, Cambridge, MA (US)

(72) Inventor: Robert J. Murphy, Westwood, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 16/548,091

(22) Filed: Aug. 22, 2019

(65) Prior Publication Data

US 2020/0007142 A1  Jan. 2, 2020

Related U.S. Application Data

(63) Continuation of application No. 16/451,624, filed on Jun. 25, 2019, now Pat. No. 10,944,415, which is a
(Continued)

(51) Int. Cl.
*H03K 5/24* (2006.01)
*H03K 19/20* (2006.01)
(Continued)

(52) U.S. Cl.
CPC ............ *H03M 1/34* (2013.01); *H03K 5/2427* (2013.01); *H03K 19/20* (2013.01); *H03K 19/21* (2013.01)

(58) Field of Classification Search
CPC .................... H03M 1/468; H03M 1/34; H01L 2924/14253; H03K 19/20–23;
(Continued)

(56) References Cited

U.S. PATENT DOCUMENTS 4,737,968 A * 4/1988 Norton ................ H04L 27/2082
331/17
8,872,688 B2 * 10/2014 Gangopadhyay ....... H03M 1/38
341/155
(Continued)

FOREIGN PATENT DOCUMENTS

JP         08242173     9/1996
WO    WO 2006/071197 A1  7/2006

OTHER PUBLICATIONS

U.S. Final Office Action dated Sep. 29, 2020 for U.S. Appl. No. 16/451,624; 23 Pages.
(Continued)

*Primary Examiner* — Patrick C Chen
(74) *Attorney, Agent, or Firm* — Daly, Crowley, Mofford & Durkee, LLP

(57) ABSTRACT

Spectrally-efficient digital logic (SEDL) techniques implement spectrally-efficient pulses (e.g., Gaussian-shaped pulses) in lieu of conventional square waveforms to improve electromagnetic, radio frequency, and other unwanted emissions. The SEDL techniques can be used for analog-to-digital converters (ADC) and digital-to-analog converters (DAC). An ADC circuit comprises a plurality of comparators configured to receive an analog input signal and compare the analog input signal to a predetermined reference signal, an encoder, and a spectrally-efficient circuit. A DAC circuit includes an integrator circuit, a clocked comparator circuit, a pulse generator, and a combiner circuit. The clocked comparator circuit receives the logic state of each SEDL pulse. The pulse generator receives the logic state and generates a scaled SEDL pulse for each input SEDL pulse. A combiner circuit combines the outputs from the pulse generator and determines analog value corresponding to the input values.

13 Claims, 26 Drawing Sheets

Related U.S. Application Data continuation-in-part of application No. 16/020,283, filed on Jun. 27, 2018, now Pat. No. 10,673,417.

(51) Int. Cl.
*H03M 1/34* (2006.01)
*H03K 19/21* (2006.01)

(58) Field of Classification Search
CPC .... H03K 3/013; H03K 3/0372; H03K 3/0375; H03K 3/0377
See application file for complete search history.

(56) References Cited

U.S. PATENT DOCUMENTS

| | | |
|---|---|---|
| 2004/0218902 A1 | 11/2004 | Yanagita |
| 2006/0098173 A1 | 5/2006 | Naka et al. |
| 2006/0098713 A1 | 5/2006 | Tian |
| 2007/0177689 A1 | 8/2007 | Beadle et al. |
| 2009/0267821 A1 | 10/2009 | Chmelar et al. |
| 2011/0018626 A1 | 1/2011 | Kojima |
| 2012/0133412 A1* | 5/2012 | Fant .................. H04L 25/063 327/307 |
| 2015/0162934 A1 | 6/2015 | Kim et al. |
| 2017/0237598 A1 | 8/2017 | Bench et al. |

OTHER PUBLICATIONS

Response to U.S. Final Office Action dated Oct. 18, 2019 for U.S. Appl. No. 16/020,283; Response filed on Feb. 7, 2020; 10 Pages.
Response to U.S. Non-Final Office Action dated Apr. 8, 2020 for U.S. Appl. No. 16/451,624; Response filed on Jun. 26, 2020; 11 Pages.
PCT International Search Report and Written Opinion dated Jan. 10, 2020 for International Application No. PCT/US2019/039490; 19 Pages.
Response to U.S. Non-Final Office Action dated Apr. 10, 2019 for U.S. Appl. No. 16/020,283; Response filed on Jul. 10, 2019; 20 Pages.
U.S. Final Office Action dated Oct. 18, 2019 for U.S. Appl. No. 16/020,283; 15 Pages.
Response to U.S. Final Office Action dated Oct. 18, 2019 for U.S. Appl. No. 16/020,283; Response filed on Jan. 15, 2020; 12 Pages.
Notice of Allowance dated Jan. 26, 2021 for U.S. Appl. No. 16/451,624; 11 pages.
Notice of Allowance dated Feb. 25, 2020 for U.S. Appl. No. 16/020,283; 14 Pages.
U.S. Non-Final Office Action dated Apr. 8, 2020 for U.S. Appl. No. 16/451,624; 29 Pages.
U.S. Appl. No. 16/020,283, filed Jun. 27, 2018, Murphy.
U.S. Appl. No. 16/451,624, filed Jun. 25, 2019, Murphy.
PCT International Preliminary Report dated Dec. 29, 2020 for International Application No. PCT/US2018/039704; 10 pages.
PCT International Preliminary Report dated Dec. 29, 2020 for International Application No. PCT/US2019/039490; 12 pages.
Invitation to Pay Additional Fees and Partial PCT Search Report dated Oct. 30, 2019 for International Application No. PCT/US2019/039490; 14 Pages.
Wentzloff et al., "System Design Considerations for Ultra-Wideband Communication" IEEE Communications Magazine (vol. 43, Issue: 8) Aug. 22, 2005; 8 Pages.
Response to U.S. Final Office Action dated Sep. 29, 2020 for U.S. Appl. No. 16/451,624; Response filed on Dec. 3, 2020; 11 pages.
Supplemental Response to to U.S. Final Office Action dated Sep. 29, 2020 for U.S. Appl. No. 16/451,624; Supplemental Response filed on Jan. 6, 2021; 11 pages.
Second Supplemental Response to to U.S. Final Office Action dated Sep. 29, 2020 for U.S. Appl. No. 16/451,624; Second Supplemental Response filed on Jan. 19, 2021; 7 pages.
Jia et al. "Modulation and demodulation method for large aperture laser scintillometer, involves forming multi-resonant oscillating circuit by digital logic apparatus, and controlling laser to emit high frequency carrier wave signal", Digital Logic Not Square Waveforms World Patents, Sep. 5, 2017, 3 pages.
Naiff "I2L Static Shift Register", Digital Logic Not Square Waveform US Patents, Sep. 5, 2017, 2 pages.
Qureshi "Fiber ring lasers and all-optical signal processing devices for wavelength-division multiplexing systems", Digital Logic Not Square Waveform Open Literature, In Dissertation Abstracts International. vol. 68, No. 02, suppl. B, Sep. 5, 2017, 11 pages.
"Transmitter for transmitting a combined clock signal and a digital data signal modulated on a carrier wave" Digital Logic Sine Waveform US Patents, Sep. 5, 2017, 27 pages.
Zhao et al. "Design of Picosecond Short Pulse Based on Dual NOT Gates Structure", Sine Waveform Open Literature, Sep. 5, 2017, 26 pages.
Partial Search Report dated Feb. 27, 2019 for International Application No. PCT/US2018/039704; 12 Pages.
Search Report dated Apr. 23, 2019 for International Application No. PCT/US2018/039704; 18 Pages.
Restriction Requirement dated Feb. 26, 2019 for U.S. Appl. No. 16/020,283; 6 pages.
Response to Restriction Requirement filed Mar. 6, 2019 for U.S. Appl. No. 16/020,283; 1 page.
Office Action dated Apr. 10, 2019 for U.S. Appl. No. 16/020,283; 16 pages.
Response to Office Action filed on Jul. 10, 2019 for U.S. Appl. No. 16/020,283; 20 pages.

\* cited by examiner

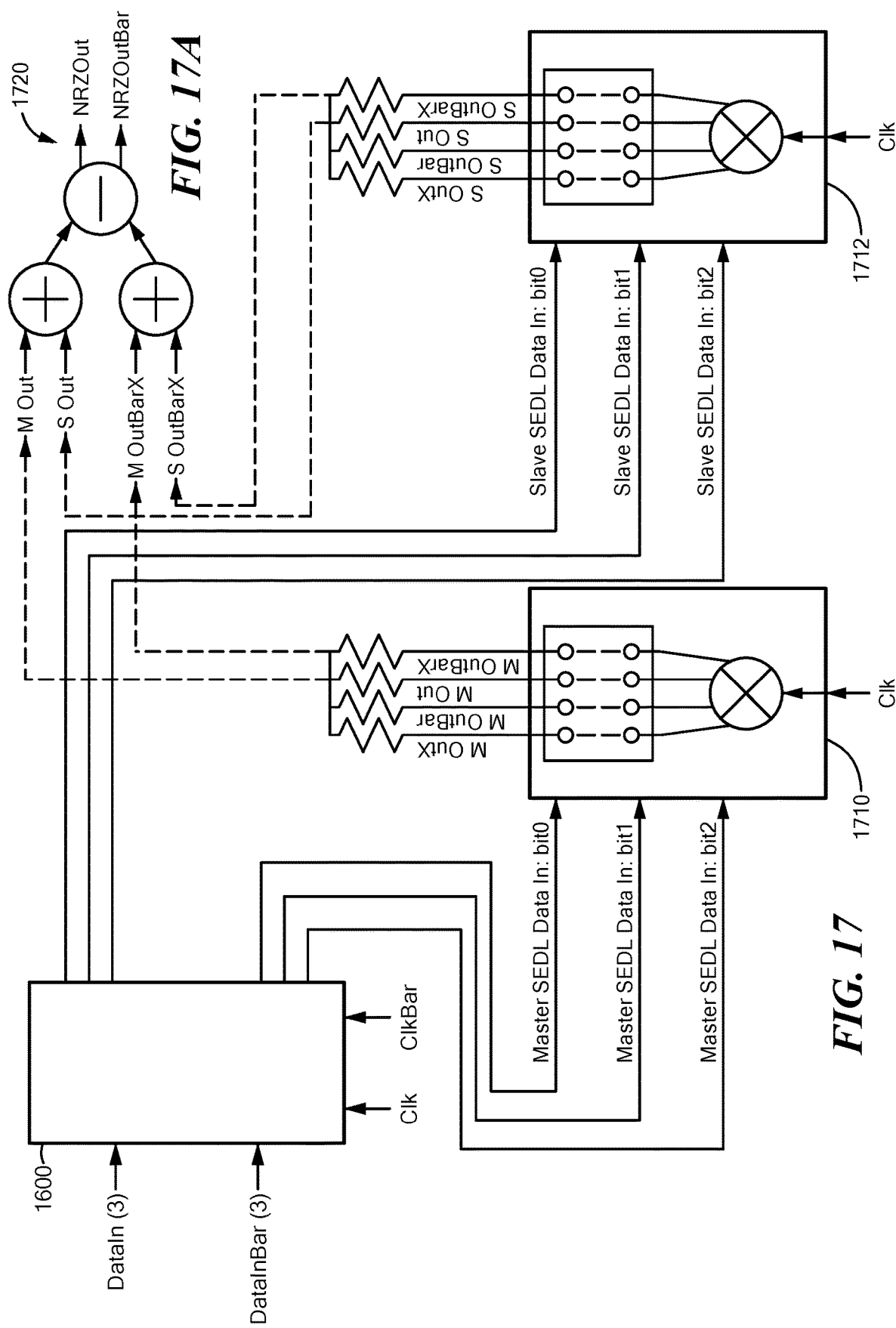

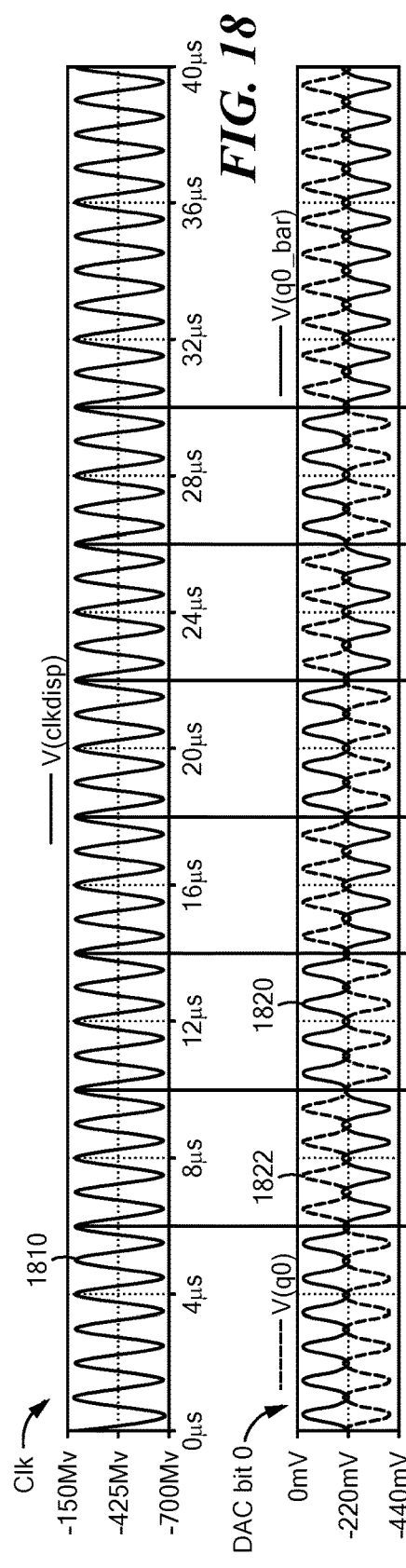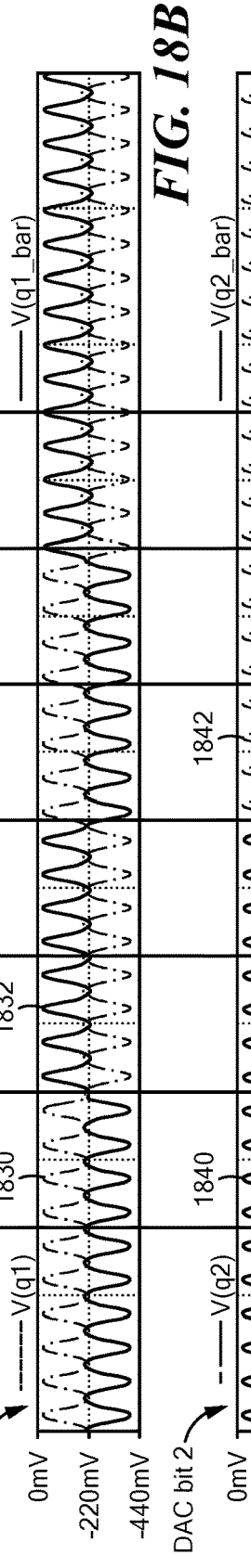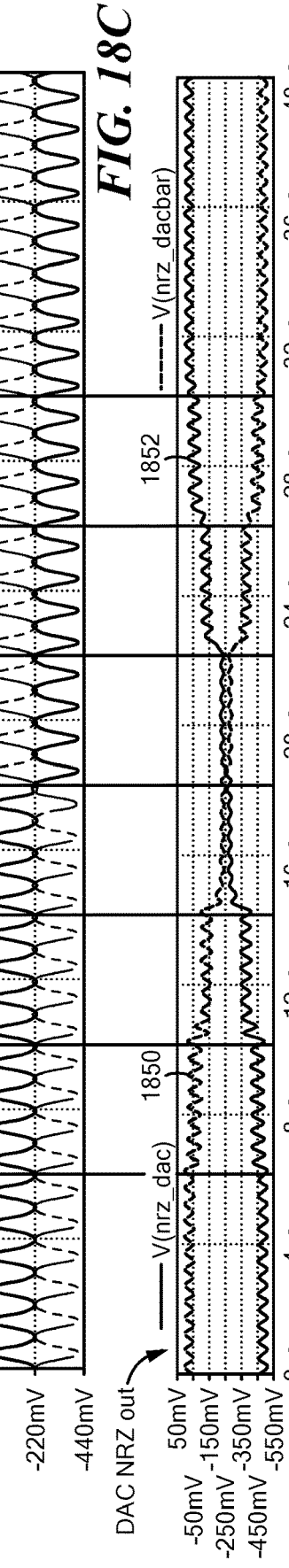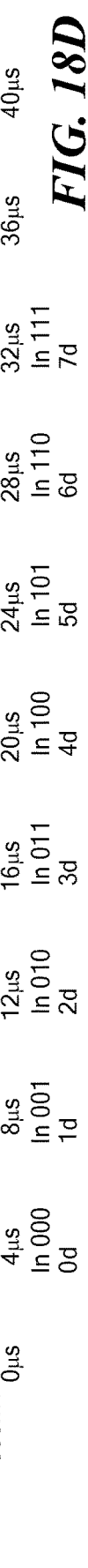
FIG. 18  FIG. 18A  FIG. 18B  FIG. 18C  FIG. 18D

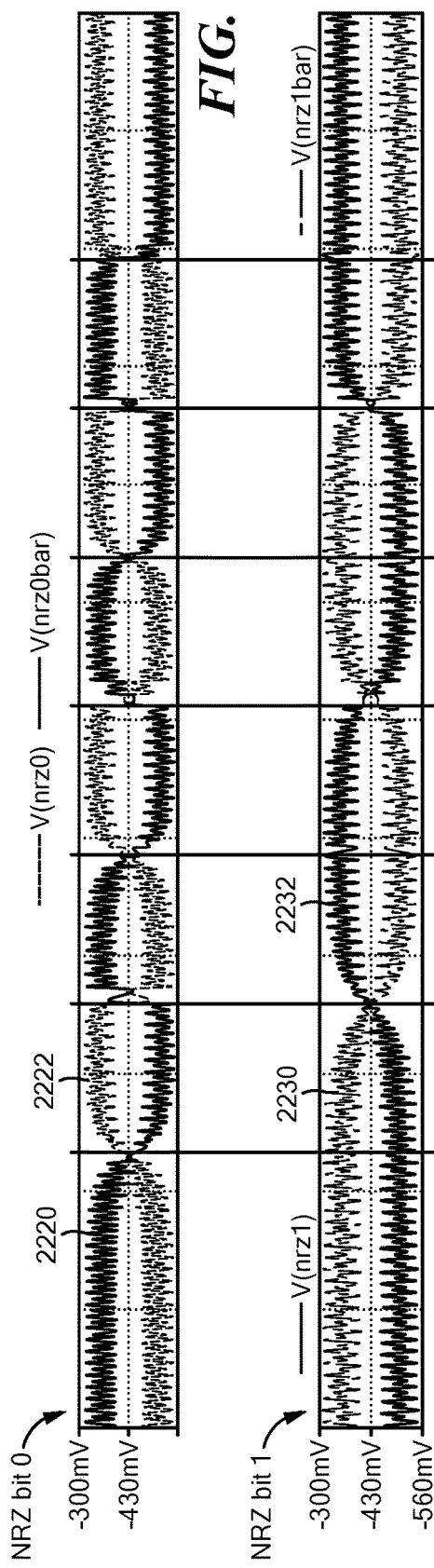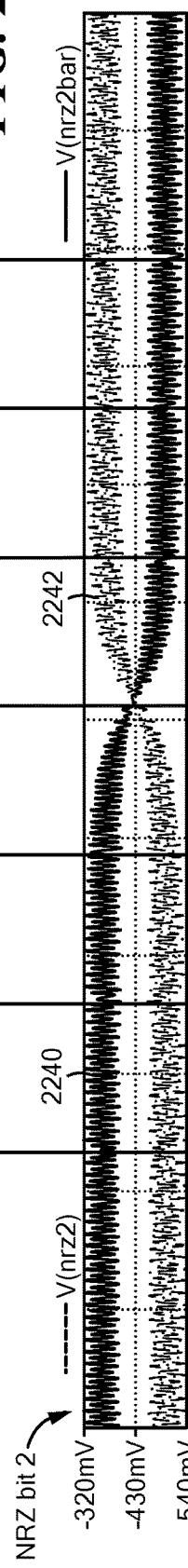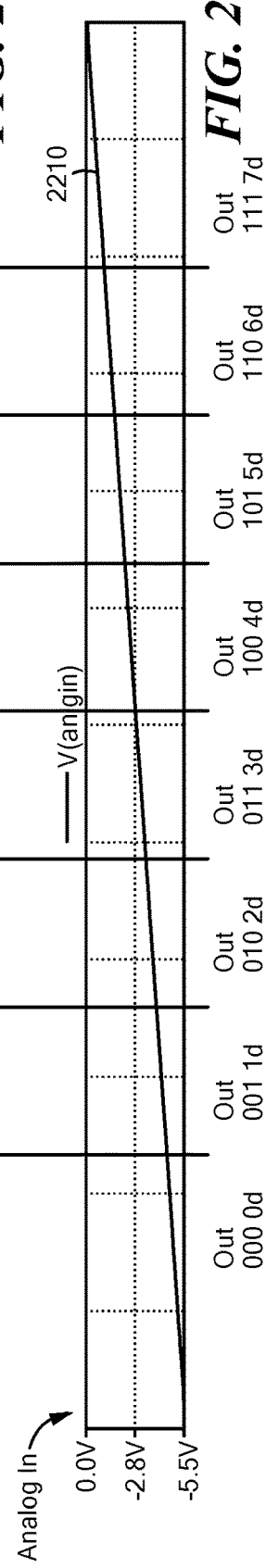

us 11,201,627 B2

SPECTRALLY EFFICIENT DIGITAL LOGIC (SEDL) DIGITAL TO ANALOG CONVERTER (DAC)

CROSS REFERENCE TO RELATED APPLICATION

This application is a continuation of co-pending U.S. application Ser. No. 16/451,624 filed on Jun. 25, 2019, which is a continuation-in-part of co-pending U.S. application Ser. No. 16/020,283, filed Jun. 27, 2018, the entire contents of which are hereby incorporated herein by reference.

GOVERNMENT RIGHTS

This invention was made with Government support under Contract No. FA8702-15-D-0001 awarded by the U.S. Air Force. The Government has certain rights in the invention.

FIELD

The concepts, systems, configurations, devices and techniques described herein relate generally to combinatorial and sequential circuits that implement digital logic.

BACKGROUND

Consumer products are required to adhere to EMI/RFI (electromagnetic interference/radio frequency interference) regulations to reduce emissions and interferences from electromagnetic and RF (radio frequency) sources. EMI/RFI may be any disturbance generated by an external source that affects an electrical circuit by electromagnetic induction, electrostatic coupling, or conduction. There is a very large industry involving EMI/RFI regulations compliance testing and/or mitigation. There is also some concern among consumers about potential health hazards associated with electromagnetic and radio frequency emissions from electronic products. Electronic products and systems are typically required to pass EMI/RFI testing to ensure that they do not pollute any components, devices, or persons in their vicinity. For example, EMI/RFI must be mitigated for cellular technology manufacturers, data service providers, computer manufacturers, aerospace systems, automotive industry, military electronics, appliance manufacturers, medical devices, and toy/video game manufacturers, among many others.

Digital circuits (e.g. a digital processor or other logic element) generally operate on signal waveforms having a square shape (e.g. a sequence of pulses having rising and falling edges which are generally square or rectangular in shape). When such square waveforms are generated, transmitted, received or otherwise used by a digital processor or other logic element, the square edges may produce spurious signals over a wide range of frequencies. Such broadband spectral content can make its way back to other components, such as sensors, actuators, and analog signal conditioners. This extraneous and unwanted spectral content often limits or degrades sensor/actuator performance. Extraneous content can make its way to sensitive electronics generally in at least two ways. First, via conducted paths, such as power supplies, grounds, etc., and second, via radiated paths, such as crosstalk, EMI, etc. Safeguarding against these sources of ingress can often be very challenging.

Systems containing sensors (of any type) are particularly susceptible to EMI/RFI emissions, for example from conductive paths or radiative paths. Even systems not containing sensors are usually required to pass EMI/RFI testing to ensure that such systems do not pollute other systems or subsystems through electromagnetic or radio frequency emissions. Electrical interference from one sub-system (often digital) can degrade the performance of another (often a sensor or an analog component).

It would, therefore, be desirable to provide a digital logic family with intrinsically low EMI/RFI emissions.

SUMMARY

An analog-to-digital converter (ADC) includes a plurality of comparators, wherein each comparator is configured to receive an analog input signal and to compare the analog input signal to a predetermined reference signal to identify a value of the input signal, and in response to the analog input signal being greater than the reference signal the comparator provides an output having a first value, and in response to the analog input signal being less than the reference signal the comparator provides an output having a second different value, an encoder configured to receive the output signal from each comparator and in response thereto to provide at least one of a plurality of bits at an output as a digital value depending upon one of the plurality of values input to the encoder, and a spectrally-efficient-based sequential circuit configured to assess a state of the digital value and to provide an output pulse having a sequentially-efficient shaped pulse.

The predetermined reference signal can be a voltage level. The value of the input signal can correspond to one of at least eight distinct analog values, wherein the output signal comprises at least three bits, and the encoder comprises an eight-input-to-three-output encoder. The spectrally-efficient-based sequential circuit can have at least three pulse generators with at least one pulse generator per encoder output. The spectrally-efficient-based sequential circuit can include at least six pulse generators with at least two pulse generators per encoder output, each two pulse generators per encoder output coupled in series. Assessing an incoming bit can include receiving an input signal, receiving a clock signal, obtaining a product signal from the product of the input and the clock signals, integrating the product signal over a clock period to determine a logic state of the input signal, providing the determined logic state to a pulse generator, and providing an output signal having a spectrally-efficient-shape at an output of the pulse generator, wherein the spectrally-efficient shaped output signal represents a logic value corresponding to the logic value of the input signal. The product signal can be integrated over a first portion of the clock period and the output signal is output by the pulse generator over a second portion of the clock period. The spectrally-efficient shaped pulses can be Gaussian-shaped pulses.

A method of converting an analog signal into a digital signal includes comparing, by at least one of a plurality of comparators, an analog input signal to at least one of a plurality of predetermined reference signal, providing an output of each comparator to an encoder, providing a digital signal at an output of the encoder representative of a value of the input signal, and assessing a state of the digital signal, by a spectrally-efficient-based circuit, and providing an output pulse having a spectrally-efficient shaped pulse.

The value of the analog input signal can correspond to one of at least eight distinct values, wherein the output signal comprises three bits, and the encoder is an eight-input to three-output encoder. The spectrally-efficient-based circuit comprises at least three pulse generators with at least one pulse generator per encoder output. The spectrally-efficient-based circuit comprises at least six pulse generators with at least two pulse generators per encoder output, each two pulse generators per encoder output coupled in series. Assessing the state of the digital signal can include receiving an input signal, receiving a clock signal, obtaining a product signal from the product of the input and the clock signals, integrating the product signal over a clock period to determine a logic state of the input signal, providing the determined logic state to a pulse generator, and providing an output signal having a spectrally-efficient-shape at an output of the pulse generator, wherein the output pulse represents a logic value corresponding to the logic value of the input signal. The input signal can be integrated over a first portion of a clock period and the output pulse is output by the pulse generator over a second portion of the clock period. The spectrally-efficient shaped pulses can be Gaussian-shaped pulses.

A method of converting an analog signal into a digital signal can include receiving at least one of a plurality of values representative of an analog input signal value at an encoder, determining a digital value corresponding to the at least one of the plurality of values, assessing a state of the digital value and outputting a pulse having a spectrally-efficient shape.

The method can include comparing, by at least one of a plurality of comparators, an analog input signal to at least one of a plurality of predetermined reference signal to determine the at least one of the plurality of values. The output can be provided as a spectrally-efficient shaped pulse output by a pulse generator. Assessing the state of the digital signal can include receiving an input signal, receiving a clock signal, obtaining a product signal from the product of the input and the clock signals, integrating the product signal over a clock period to determine a logic state of the input signal, providing the determined logic state to a pulse generator, and providing an output signal having a spectrally-efficient-shape at an output of the pulse generator, wherein the spectrally-efficient shaped output signal represents a logic value corresponding to the logic value of the input signal. The input signal can be integrated over a first portion of a clock period and the output signal is output by the pulse generator over a second portion of the clock period.

A digital-to-analog converter (DAC) circuit includes an integrator circuit having an input configured to receive an input signal provided from a plurality of spectrally-efficient shaped digital logic (SEDL) pulses, with each SEDL pulse representing one or more bits of the input signal and wherein the integrator circuit is configured to determine a logic state represented by each of the plurality of SEDL pulses, a clocked comparator circuit coupled to the integrator circuit and configured to receive the logic state of each SEDL pulse and in response thereto, to provide a clocked comparator circuit signal at an output thereof, a pulse generator having a first input coupled to an output of the integrator circuit and a second input coupled to an output of the clocked comparator circuit, wherein, in response to receiving a logic state and a clocked comparator circuit signal, the pulse generator generates a scaled SEDL pulse for each input signal SEDL pulse, a combiner circuit coupled to the output of the pulse generator and configured to combine outputs provided thereto from the pulse generator and determine analog values corresponding to the input pulses.

A first amplitude of the SEDL pulse is set by a first gain circuit, an offset current source, and a signal current source of the first clocked comparator circuit. The first gain circuit comprises at least two resistors, the offset current source comprises a third resistor, and the signal current source comprises a fourth resistor. The at least two resistors have a same first value, wherein the third resistor has a third value, different from the first value, and wherein the fourth resistor has a fourth value, different from the first and third values. The DAC can further include a second pulse generator having an input coupled to the output of the integrator circuit and a second input coupled to an output of a second clocked comparator circuit, wherein, in response to receiving a logic state and a second clocked comparator signal, the second pulse generator generates a second scaled SEDL pulse representative of the second input pulse, wherein a second amplitude of the second scaled spectrally-efficient shaped pulse is set by a second gain circuit, a second offset current source, and a second signal current source of the second clocked comparator circuit, the second amplitude being different than the first amplitude. The DAC can further include a third pulse generator having an input coupled to the output of the integrator circuit and a second input coupled to an output of a third clocked comparator circuit, wherein, in response to receiving a logic state and a third clocked comparator signal, the third pulse generator generates a third scaled SEDL pulse representative of the third input pulse, wherein a third amplitude of the third spectrally-efficient shaped pulse is set by a third gain circuit, a third offset current source, and a third signal current source of the third clocked comparator circuit, the third amplitude being different than the first amplitude and the second amplitude. The output of the first, second, and third pulse generators are summed together to provide one of eight possible values for an analog signal value that correspond to the logic state of the input signal having at least three bits to provide eight corresponding analog values. The integrator circuit can be configured to integrate the input pulse over a first portion of a clock period and the scaled spectrally-efficient pulse is output by the first pulse generator over a second portion of the clock period. The integrator circuit can be configured to integrated the first input pulse, the second input pulse, and the third input pulse over a first portion of the clock period, and the first, second, and third scaled spectrally-efficient shaped pulses are output by the first, second, and third pulse generators during a second portion of the clock period.

A method of converting a digital signal into an analog signal includes receiving an input signal having at least one spectrally-efficient digital logic (SEDL) pulse, a logic state of the at least one spectrally-efficient shaped pulse is provided by an integration of the input signal by an integration circuit configured to determine a logic state represented by each of a plurality of SEDL pulses of the input signal, receiving the determined logic state at a first pulse generator, and providing a scaled output signal having a spectrally-efficient shape at an output of the first pulse generator.

The input signal includes at least three bits, with a first bit value provided to a first pulse generator, a second bit value provided to a second pulse generator and a third bit value provided to a third pulse generator. The first pulse generator is coupled to a first clocked comparator comprising a first gain circuit, a first signal current source, and a first offset current source to determine an amplitude of first pulses for the output signal, the second pulse generator is coupled to a second clocked comparator comprising a second gain circuit, a second signal current source, and a second offset current source to determine an amplitude of second pulses for the output signal, and the third pulse generator is coupled to a third clocked comparator comprising a third gain circuit, a third signal current source and a third offset current source to determine an amplitude of third pulses for the output signal. Determining a logic state includes comparing a the spectrally-efficient signal to a complementary spectrally-efficient signal. The method further includes summing the output of the first, second, and third pulse generators together to provide one of eight possible values for an analog signal value that correspond to the logic state of the input signal having at least three bits. The integration of the input signal occurs during a first portion of a clock cycle, and wherein generating a scaled spectrally-efficient pulse occurs during a second portion of the clock cycle.

A digital-to-analog converter (DAC) circuit includes an integrator circuit configured to determine a logic state of at least three bits of an input signal, the input signal having a plurality of spectrally-efficient shaped pulses, a first clocked comparator circuit configured to receive the logic state of at least a first input pulse of the input signal, a first pulse generator having an input coupled to the output of the integrator circuit and configured to receive a logic state and generate, together with the first clocked comparator, a first scaled spectrally-efficient pulse, a second clocked comparator circuit configured to receive the logic state of at least a second input pulse of the input signal, a second pulse generator having an input coupled to the output of the integrator circuit and configured to receive a logic state and generate, together with the second clocked comparator, a second scaled spectrally-efficient pulse, a third clocked comparator circuit configured to receive the logic state of at least a third input pulse of the input signal, a third pulse generator having an input coupled to the output of the integrator circuit and configured to receive the logic state and generate, together with the third clocked comparator, a third scaled spectrally-efficient pulse, and a spectrally-efficient circuit coupled to the output of the first, second and third pulse generators, configured to combine the output of the first, second, and third pulse generators to determine an analog value to which the three input pulses correspond.

The amplitude of the first scaled spectrally-efficient shaped pulse is set by a first clocked comparator circuit comprising a first gain circuit, an offset current source, and a signal current source of the first clocked comparator circuit. The first gain circuit comprises at least two resistors, the offset current source comprises a third resistor, and the signal current source comprises a fourth resistor. The first, second and third input pulses are integrated over a first portion of a clock period, and the first, second and third scaled spectrally-efficient shaped pulses are output over a second portion of the clock period.

BRIEF DESCRIPTION OF THE DRAWINGS

The foregoing features may be more fully understood from the following description of the drawings in which:

FIG. 17 is a block diagram detailing the SEDL DAC showing a three-bit master slave SEDL DAC flip-flop and a three-bit slave SEDL DAC flip-flop;

FIG. 17A is a diagram of a combiner that is responsive to SEDL pulses output by the circuit of FIG. 17;

FIG. 18 is a plot of voltage vs. time showing a clock signal of the SEDL DAC circuit;

FIG. 18A is a plot of voltage vs. time of a DAC bit0 (first bit) of the input signal;

FIG. 18B is a plot of voltage vs. time of a DAC bit1 (second bit) of the input signal;

FIG. 18C is a plot of voltage vs. time of a DAC bit2 (third bit) of the input signal;

FIG. 18D is a plot of voltage vs. time showing a DAC NRZ output;

FIG. 22 is a plot of voltage vs. time of a NRZ bit0 output of a SEDL ADC circuit;

FIG. 22A is a plot of voltage vs. time of a NRZ bit1 output of a SEDL ADC circuit;

FIG. 22B is a plot of voltage vs. time of a NRZ bit2 output of a SEDL ADC circuit; and FIG. 22C is a plot of voltage vs. time of a corresponding analog input signal for a SEDL ADC circuit.

Figure 1:
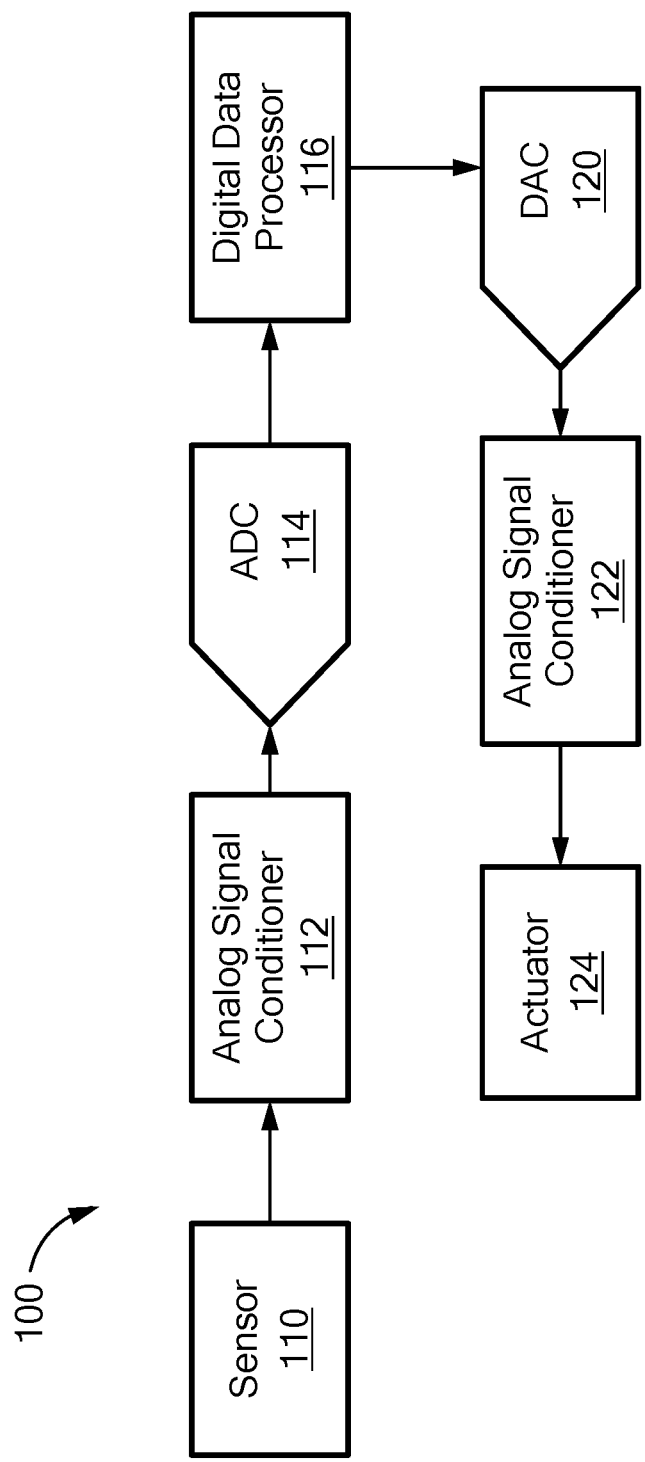
FIG. 1 is a block diagram of an illustrative system containing one or more sensors and operable with spectrally efficient digital logic (SEDL)

It should be appreciated that the drawings are not necessarily to scale, or inclusive of all elements of a system, emphasis instead generally being placed upon illustrating the concepts, structures, and techniques sought to be protected herein.

DETAILED DESCRIPTION

Before proceeding with a discussion of illustrative embodiments of spectrally efficient digital logic (SEDL) techniques (referred to herein as "SEDL" or "spectrally-efficient" techniques), some introductory concepts and terminology are explained.

In general overview, the term "digital logic circuit" (or more simply "logic circuit" or "logic element") refers to a circuit or device capable of receiving one or more input signals (or more simply "inputs") and in response thereto, providing one or more output signals (or more simply "outputs") with the output signal having a Boolean logic relationship to the input signal. One type of logic circuit is a logic gate (such as an AND gate). Digital logic circuits may have one or more inputs, and one or more outputs. Individual logic circuits can be connected or otherwise coupled to form combinatorial or sequential circuits, or relatively complicated logical functions that can include both combinatorial (e.g., gate) and sequential (e.g., flip-flop) components. Known digital logic families include, but are not limited to, transistor-transistor logic (TTL), complementary-metal-oxide semiconductor (CMOS) logic, and emitter-coupled logic (ECL), for example.

The spectrally efficient techniques disclosed herein are applicable to both CMOS and bipolar technologies, as well as optical transceivers, and more generally any system that receives signals and performs digital logic or processing.

In accordance with an embodiment of concepts, systems, methods and devices described herein, rather than providing or otherwise utilizing conventional square waves to represent an incoming bit (or to output a logical 1 or 0 from a spectrally efficient waveform), in accordance with the techniques described herein, spectrally efficient waveforms (e.g., waveforms which include pulses having a Gaussian or other spectrally efficient shape) may be provided to a digital circuit such as a digital processor. The spectrally efficient waveforms reduce spectral content and, thus, reduce EMI/RFI produced by the associated circuit(s).

One advantage of using spectrally efficient pulses as compared to a conventional digital waveform (such as a square wave), for example, is that spectrally efficient pulses do not make use of fast-edge switching. Waveforms which include square edges needed for fast edge switching produce a relatively large number of "harmonic signals" (or more simply "harmonics"). Such undesired harmonic signals can be a source of undesired bit errors (sometimes referred to as "logic glitches" or more simply "glitches") in digital circuits. Thus, conventional logic systems which operate with square shaped waveforms having sharp or square edges are susceptible to logic glitches.

A spectrally efficient waveform is a waveform which produces relatively few "harmonic signals" (or more simply "harmonics"). Thus, the spectrally efficient logic concepts, techniques, systems and devices described herein are tolerant of noise, distortion, and logic glitches as compared to conventional logic systems and techniques.

The SEDL architecture of the present disclosure is more resilient than conventional logic. Furthermore, the spectrally efficient signals also contain a strong clock component, rendering clock recovery easy. Further still, the spectrally efficient techniques also potentially allow the digital portion of an integrated circuit (IC) to be developed using a similar process that is used for the analog/RF portion of the IC, which can simplify development and manufacturing of the IC.

As will be described herein, the spectrally efficient waveforms in accordance with the concepts described herein can be implemented in both combinatorial logic circuits and sequential logic circuits as well as in circuits which include both combinatorial logic and sequential logic in a same circuit.

Using spectrally efficient pulses in combinatorial and/or sequential logic circuits reduces emissions while achieving the same functionality as conventional square waveforms. Additional advantages of the spectrally efficient pulses described herein include reduced supply/ground "bounce" at the signal transitions (bounce in the signal is greatly reduced at signal state transitions), reduced distortion present on imperfect interconnect transmission line, and reduced EMI/EMC (electromagnetic interference/electromagnetic compatibility) crosstalk, which scales with frequency due to the reduced high frequency content at the same data rate. The emissions are reduced in at least conducted and radiated emissions. Enhanced determination of logic state is achieved through the spectrally efficient pulses, which are noise and distortion tolerant and compatible with standard logic families. The spectrally efficient pulses and concepts described herein can be applied to build an entire logic system or certain desired portions of an overall system. Thus, after reading the disclosure provided herein, it will be appreciated that the SEDL waveforms can be used for either the combinatorial or the sequential circuits, or in circuits including both combinatorial and sequential components, to achieve low EMI/RFI in accordance with the present disclosure.

It should thus be appreciated that the broad concepts described herein are not limited to any particular implementation details such as a specific arrangement of circuits. Rather the broad concepts described herein may be applied to a wide variety of different arrangement of combinatorial and/or sequential circuits while maintaining structural relationships to provide a spectrally efficient system.

As used herein, "and/or" means "and" or "or", as well as "and" and "or." Also, "at least one of X and Y" means "X or Y" as well as "X and Y." Moreover, all patent and non-patent literature cited herein is hereby incorporated by references in its entirety for all purposes.

Turning now to FIG. 1, a system 100, which may be any appropriate instrumentation or device, such as a cell phone or other system having one or more sensor(s) and in some cases actuators as well, includes at least one sensor 110 coupled to an analog signal conditioner 112. The analog signal conditioner 112 conditions (e.g. filters, amplifies, or otherwise processes) the signal received from the sensor 110 and provides the conditioned signal to an analog-to-digital converter (ADC) 114. The ADC receives the signal provided there to and converts the analog signals from signal conditioner 112 into a stream of digital bits. The stream of digital bits produced by ADC 114 are provided to an input of a digital data processor 116 for subsequent processing. In some cases, the resulting process is used to drive actuators via a path including a digital-to-analog converter (DAC) 120, an analog signal conditioner 122, and an actuator 124.

Figure 3:
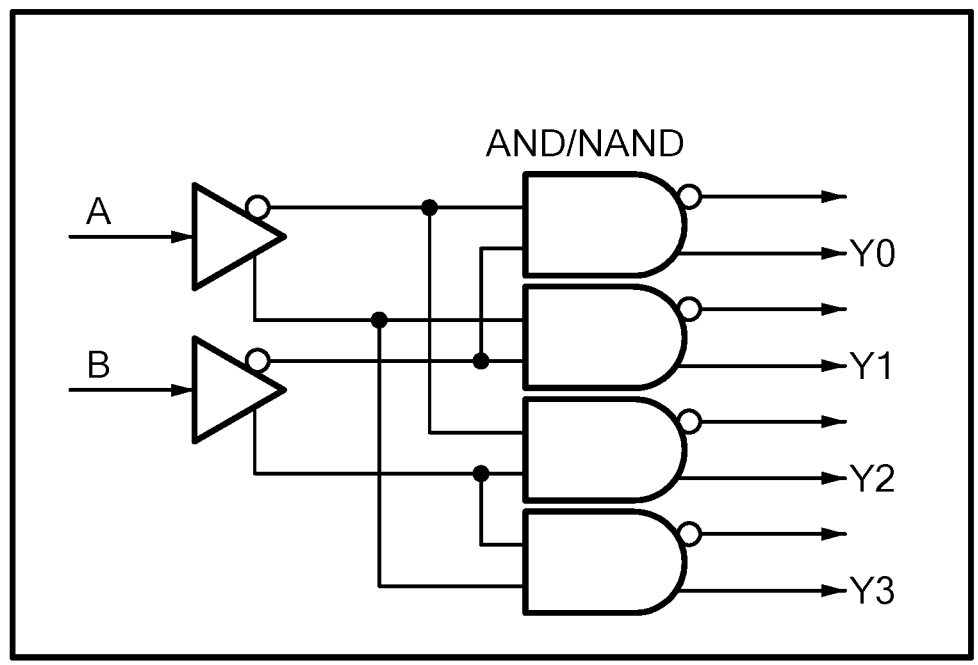
FIG. 3 is a schematic circuit diagram showing an example combinatorial circuit for an address decoder operable with SEDL.
Figure 6:
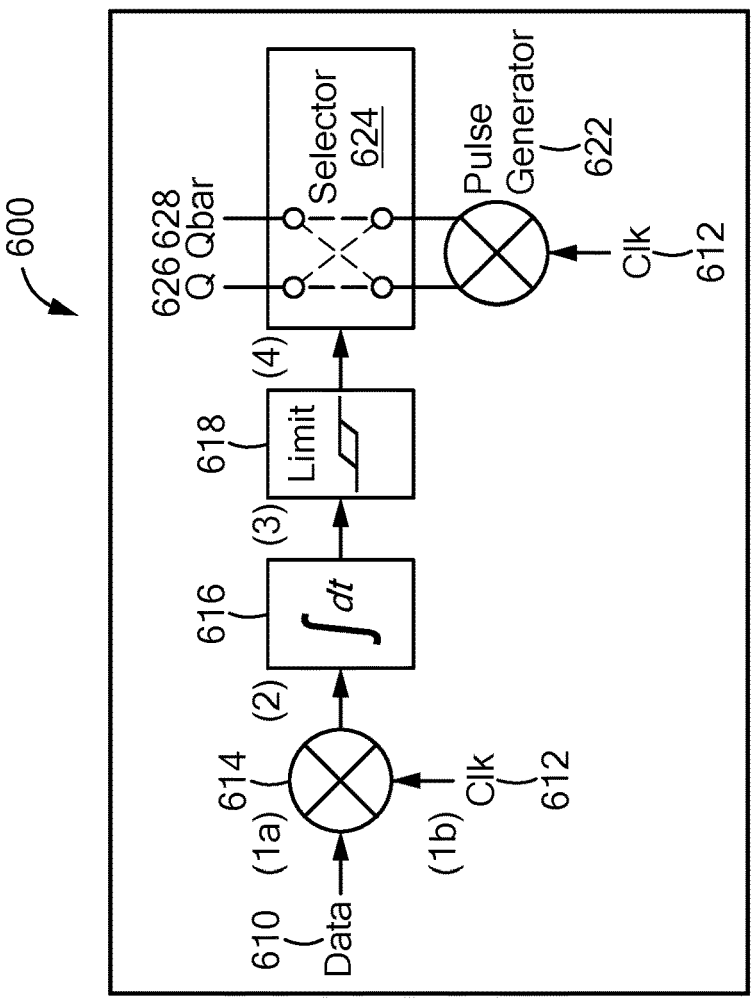
FIG. 6 is a block diagram showing an example sequential circuit to implement the SEDL techniques of the present disclosure.
Figure 5:
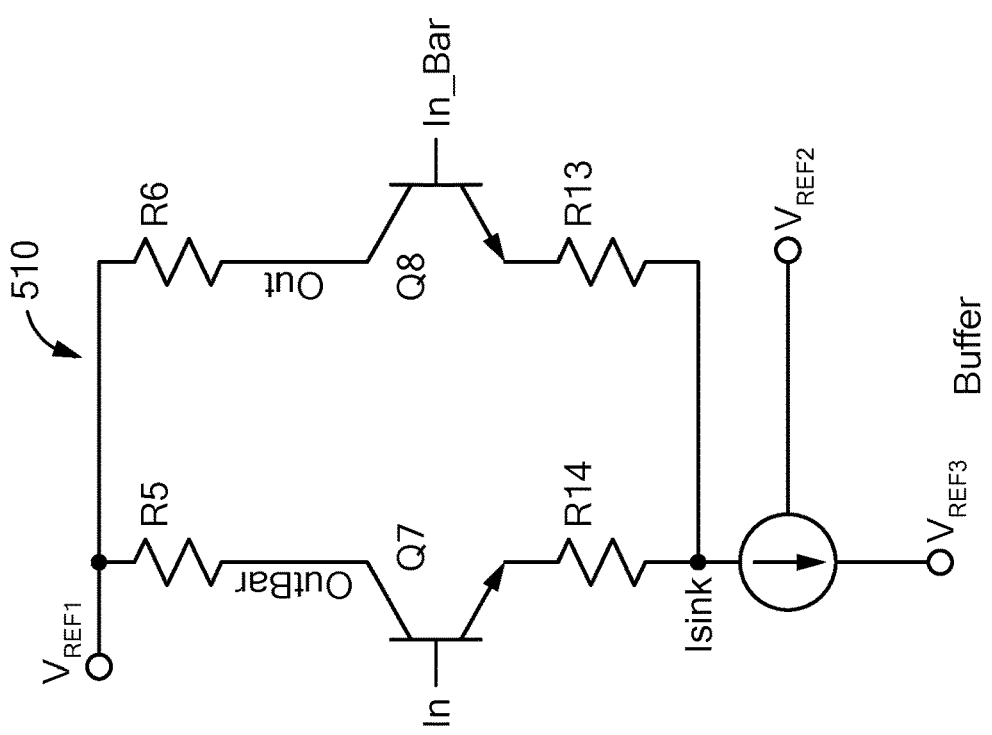
FIG. 5 is a schematic diagram showing an example combinatorial buffer circuit operable with SEDL.

The concepts of the present disclosure output spectrally efficient pulses at the output of the ADC 114 and receive spectrally efficient pulses at the DAC 120, which determines the logic state using pulses, as will be appreciated upon reading the present disclosure. Refer to FIGS. 3 and 5 showing example combinatorial circuits using SEDL concepts and refer to FIG. 6 showing an example sequential circuit using the SEDL concepts.

It should be appreciated that although only one sensor and one actuator are shown in FIG. 1, the concepts described herein are applicable to systems which include one or more sensors and one or more actuators, as well as to complex systems having multiple instances of system 100 as shown in FIG. 1 connected together to provide multiple sensors and multiple actuators under control of multiple processors or a single processor.

Example sensors for the sensor 110 include magnetic field sensors, motion sensors, microphones, acoustic sensors, optical receivers, RF sensors, electromagnetic sensors, or any other sensor that senses a parameter or other feature of an object or incoming signal (such as an optical or RF signal) and generates an analog or digital signal or otherwise uses digital logic. It will be appreciated that some sensors may be coupled to an ADC and may generate an analog signal that is digitized by the ADC, or may have an integrated ADC to produce a digital signal. The spectrally efficient techniques herein are applicable to both types of sensors to evaluate an incoming bit and output a Gaussian pulse as opposed to a conventional square waveform.

Figure 2:
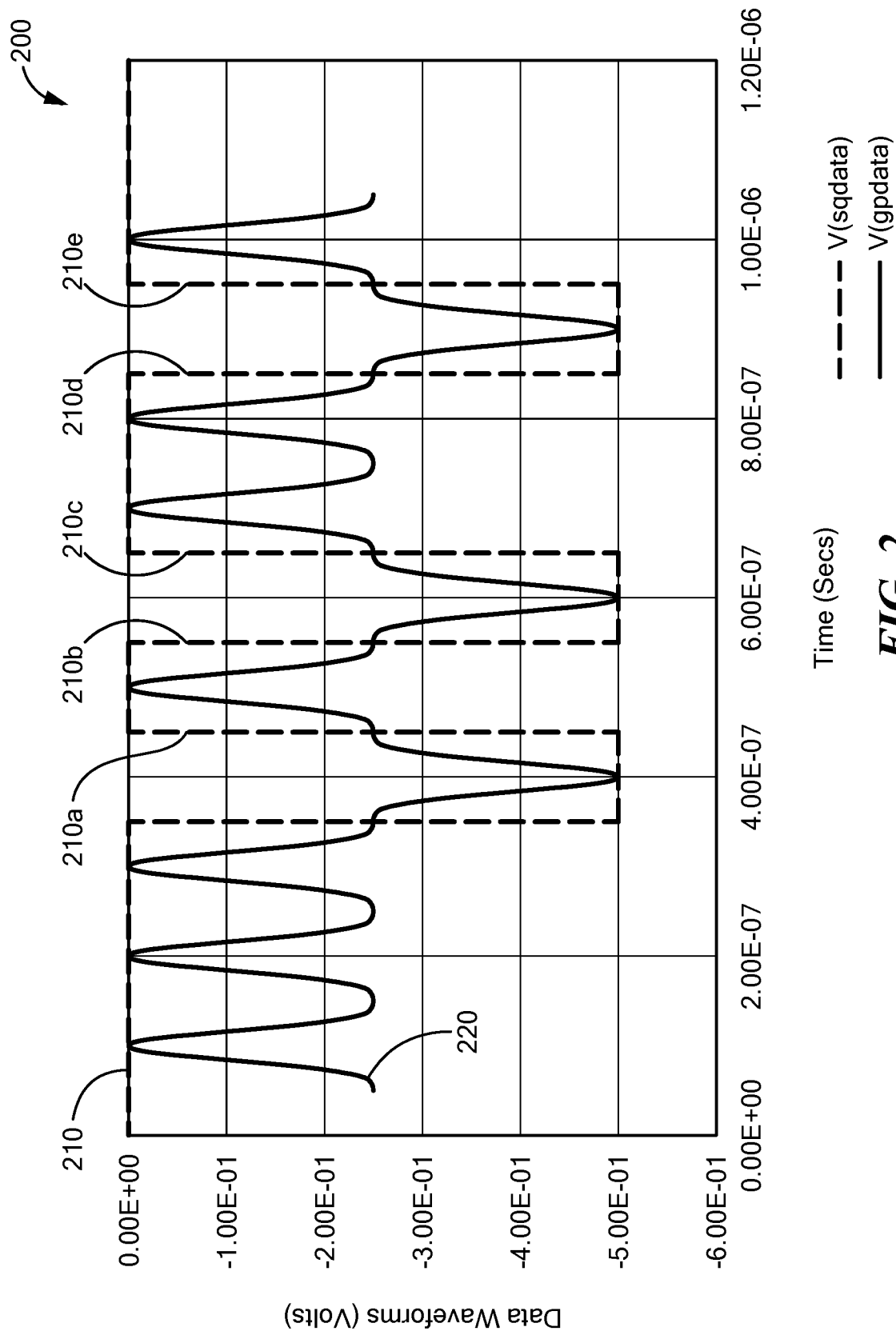
FIG. 2 is a graphical diagram in the time domain (i.e. a plot of voltage vs. time) showing an example of a conventional logic waveform and an example of a spectrally efficient example waveform.

Referring now to FIG. 2, a conventional waveform 210 has rising and falling edges having a substantially square shape. See, for example, rising edges 210a, 210c, 210e of the square waveform 210 and falling edges 210b, 210d of the square waveform 210. As noted above, such square edges can generate undesired spectral content. The square signals contain two levels representing binary states 0 and 1, with the transition between logic states (e.g. a "0" state and a "1" state) occurring in a short period of time (generally referred to as a "narrow transition" between logic states). When such narrow transitions are combined with a relatively high I/O count (due to a circuit receiving or transmitting a large number of signals) a relatively high level of emissions may result. This is undesirable.

Waveform 220, on the other hand, corresponds to a spectrally efficient digital logic (SEDL) waveform which includes the same information (bits of data) as waveform 210. In an embodiment, the pulses which exist in the SEDL waveform 220 are formed using one or more Gaussian shaped pulses.

As illustrated in FIG. 2, each bit of data in the square waveform 210 has a corresponding set of Gaussian pulses (with a set of pulses defined herein as one or more pulses) in the spectrally efficient waveform 220. Note that the transition between logic states in a spectrally efficient waveform takes a longer period of time as compared to such a transition in a conventional square waveform. Thus, the spectrally efficient waveform is said to have a slower transition timing than a conventional waveform having rectangular or square-shaped pulses. With each bit is represented by one Gaussian-shaped pulses producing a corresponding Gauss shaped frequency spectrum and is more spectrally efficient (i.e., has fewer harmonics and/or occupies a smaller portion of the frequency spectrum) than a conventional rectangular (square-shaped) pulse.

A Gaussian-shaped pulse can be expressed as EXP −0.5* $(t/\sigma)^2$ Fourier Transform→$\sigma$*sqrt($2*\pi$)*EXP −0.5*$(\omega*\sigma)^2$, where t is time, $\omega$ is angular frequency, and $\sigma$ is 14.74% of a bit period. Another useful property of a Gaussian-shaped pulse is that it survives integration and/or differentiation as occurs in filtering operations. Gaussian pulse also eliminate the need for an associated clock to the square wave, as each bit is represented by a Gauss shaped pulse.

Note that by replacing the conventional square waveform with a spectrally efficient waveform having a plurality of pulses, the pulses not only provide the logic value (high or low), but also provide the number of instances of that logic value (e.g., the number of bits). So rather than providing a logical high or low, the spectrally efficient waveform provides separate pulses for each logic value that correspond to each bit of the waveform.

When receiving an incoming SEDL waveform, in order to derive the logical value associated with each of the SEDL pulses, a complementary SEDL signal is compared to the original SEDL signal. The Gauss pulse data is differential so that the data signal is actually the signal minus its complement. The original SEDL signal minus its complementary signal has a value comparable to the conventional square wave peak to peak value.

Although described in some instances as being a Gaussian Pulse shaped waveform, it should of course, be appreciated that any spectrally efficient waveform can be implemented in accordance with the present disclosure. Other examples of spectrally efficient waveforms include (1) approximations to Gaussian pulses, (2) sinusoidal waveforms, (3) a non-return-to-zero (NRZ) waveform (e.g., formed by summing the outputs of two cascaded SEDL flip-flops) which appears to be similar to traditional square waves, but it is spectrally efficient due to the slow edges on bit transitions.

Figure 4:
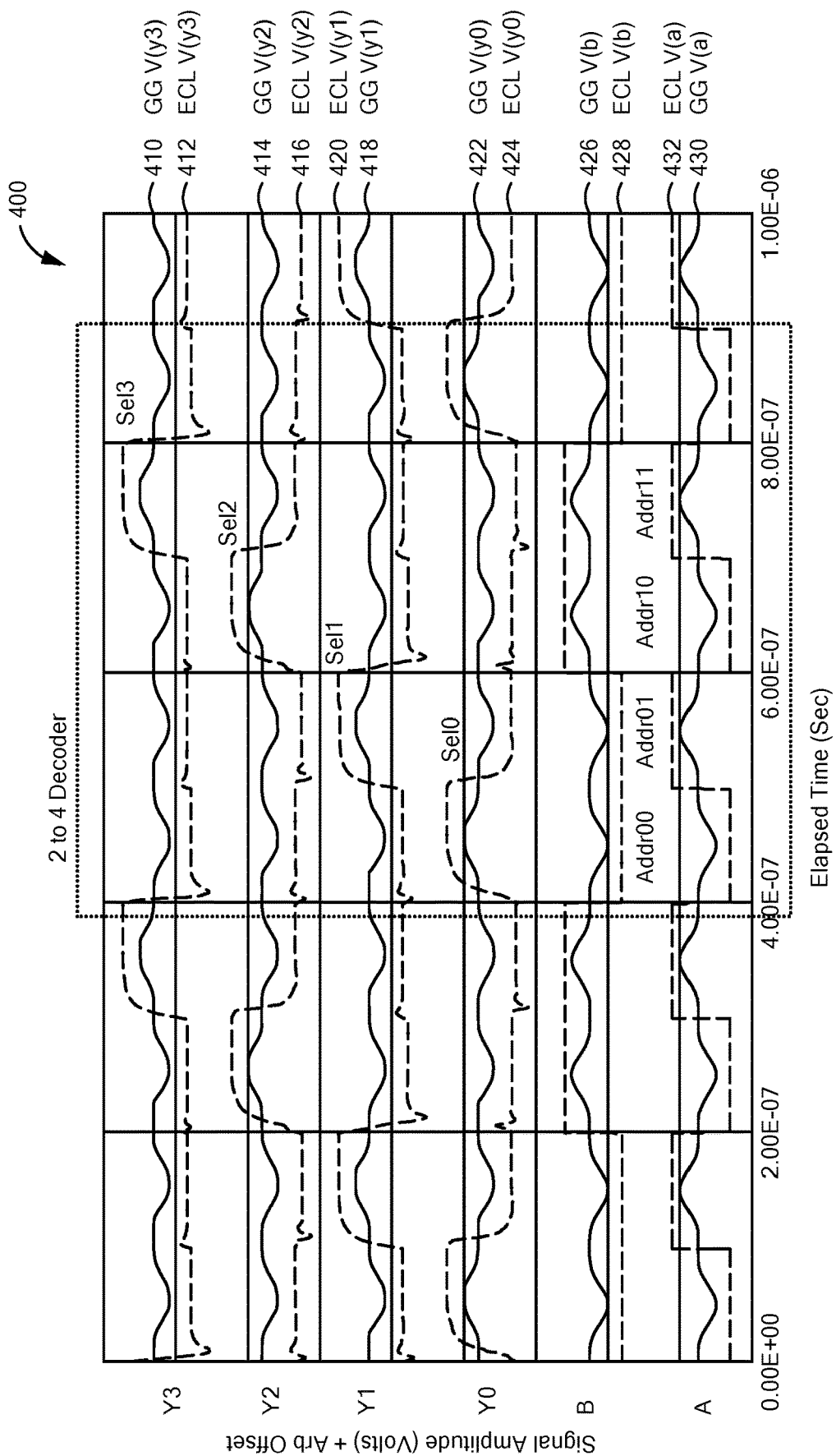
FIG. 4 is a graphical diagram in the time domain showing example conventional logic waveforms and example SEDL waveforms for the combinatorial circuit of FIG. 3.

Reference is now made to FIGS. 3-4 showing an example combinatorial circuit for an address decoder and the various signals associated therewith, in accordance with an embodiment of the present disclosure. FIG. 3 is a schematic circuit diagram showing an example combinatorial circuit 300 for an address decoder, and FIG. 4 is a graphical diagram 400 showing both conventional logic example waveforms and spectrally efficient example waveforms for the combinatorial circuit of FIG. 3.

Referring first to FIG. 3, an illustrative address decoder circuit 300 is an example combinatorial circuit capable of receiving a 2 bit address (A, B) and has four (4) corresponding device select lines (Y0, Y1, Y2, Y3). The address decoder circuit 300 is operable with SEDL pulses (i.e. spectrally-efficient waveforms) to implement the digital logic without any modifications required to the circuit design.

Thus, in response to one or more spectrally-efficient pulses corresponding to an address for a particular device provided to the decoder circuit address inputs A, B the decoder provides an output signal on a selected one of outputs Y0, Y1, Y2, Y3 for the particular device. It should be appreciated that although FIG. 3 illustrates a single address decoder capable of serving multiple devices coupled to an address bus (i.e. each device coupled to one of outputs Y0, Y1, Y2, Y3), the SEDL pulses described herein are also useful when used with a dedicated, single-output address decoder which may be incorporated into each device on an address bus.

Various input and output waveforms are shown in FIG. 4 as both square waveforms and Gaussian pulse-shaped waveforms to illustrate use of both types of waveforms in the combinatorial circuit. The waveforms show the same information, with each bit in the conventional square wave being represented by either a logical high or low value, and each bit in the SEDL waveform being represented by a pulse.

As shown in FIG. 3, the input of the OR gate 310 is coupled to input signal "B". Similarly, the first input of the OR gate 312 is coupled to the input signal "A". The output of the OR gate 310 is coupled to each of the AND (or NAND) gates 320, 322, 324, 326. The output of the OR gate 312 is coupled to the other input for each of the AND (or NAND) gates 320, 322, 324, 326. The output of the AND gates 320, 322, 324, 326 are the select lines Y0, Y1, Y2, Y3, respectively.

As shown in FIG. 4, input signals A and B (and identified with reference numerals 426, 430) are used to select lines Y0, Y1, Y2, or Y3 on the decoder. Significantly, inputs A and B are spectrally-efficient waveforms 430, 426.

For comparison, corresponding conventional square waveforms 432, 428 are also shown.

As shown, when A is 0 and B is 0 the output is Y0; when A is 1 and B is 0, the output is Y1; when A is 0 and B is 1 the output is Y2; and when A is 1 and B is 1 the output is Y3. This provides four select lines using two inputs and same result using square and Gaussian-shaped pulse waveforms. Note that the spectrally-efficient waveforms provide the same output without emissions concerns associated with conventional square waveforms. The Gaussian pulse can nominally have a fixed value within a given logic family. For example, the Gaussian pulse can have a 0.25 volts peak for this implementation of a CML/ECL type of cases. Other values can be used, however, for different implementations. For example, TTL can be 0V for a logic 0 ("low") and 5V or 3.3V for a logic 1 ("high"). Different voltage values can be used for different SEDL families.

FIG. 5 is a schematic diagram showing an example combinatorial buffer circuit 510, in accordance with an embodiment of the present disclosure. The combinatorial buffer circuit 510 includes a unity gain, current source fed, differential buffer. This provides the signal in true and complementary form. The logic element is an ECL-like "OR" structure (not shown). The potential at the emitter coupled junction of the logic element, is the logical "OR" of its inputs. When using conventional square-shaped waveforms, it is desired to have as much gain as possible to force the signal into a square waveform shape. However, it is not desired to have this same gain when using spectrally-efficient pulses. In fact, the opposite (a reduction in gain) is desired to ensure that the signal does not try to lock into square shape. Thus, resistors (R5, R6, R15, R16) are added to the logic element to reduce gain, so it does not try to force the signal into a square-shaped waveform and thus retains the spectrally-efficient waveform pulses.

Figure 7:
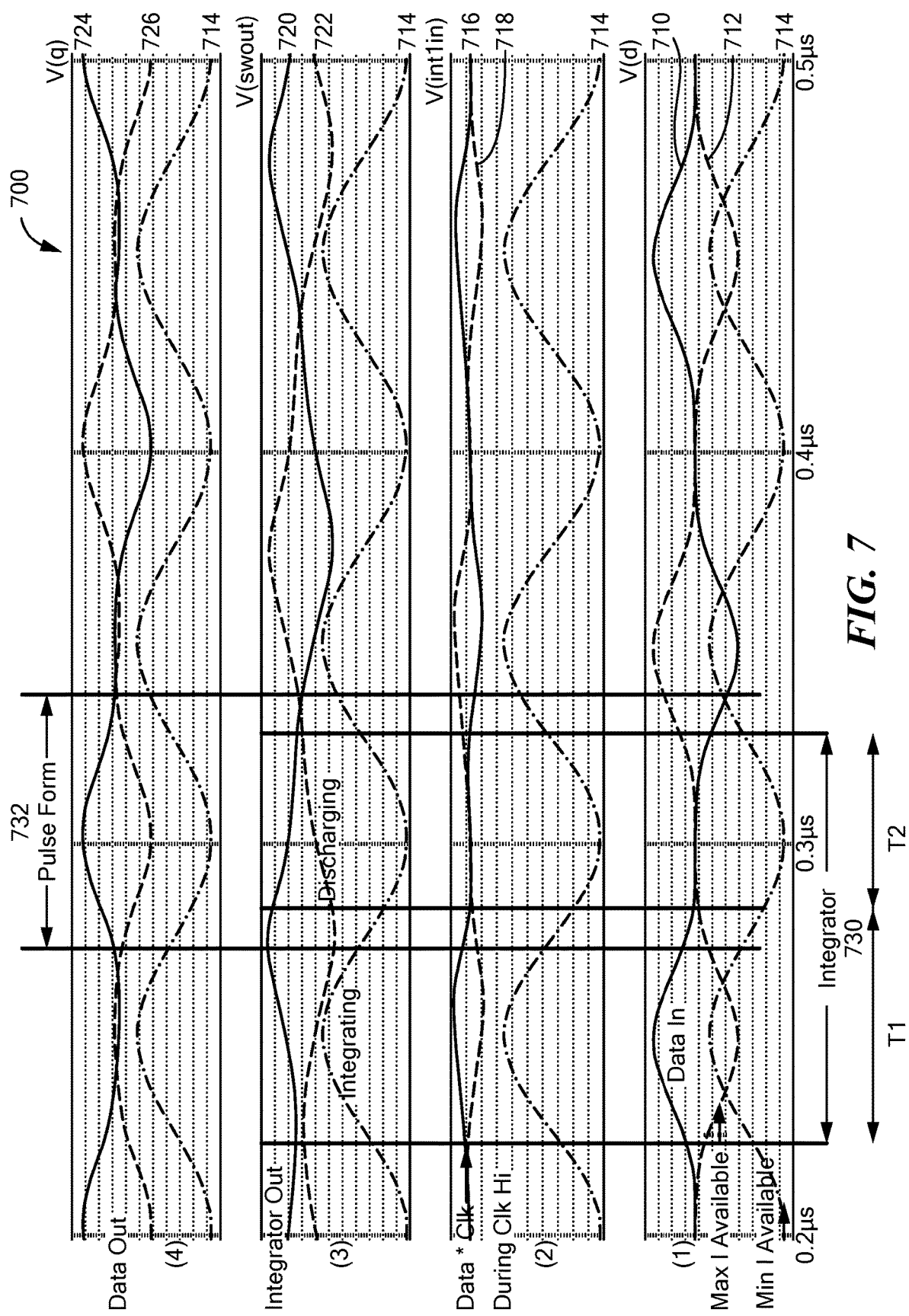
FIG. 7 is a graphical diagram showing various signals of the example sequential circuit of FIG. 6, illustrating an integrating portion and a discharging portion of the signal processing.
Figure 8:
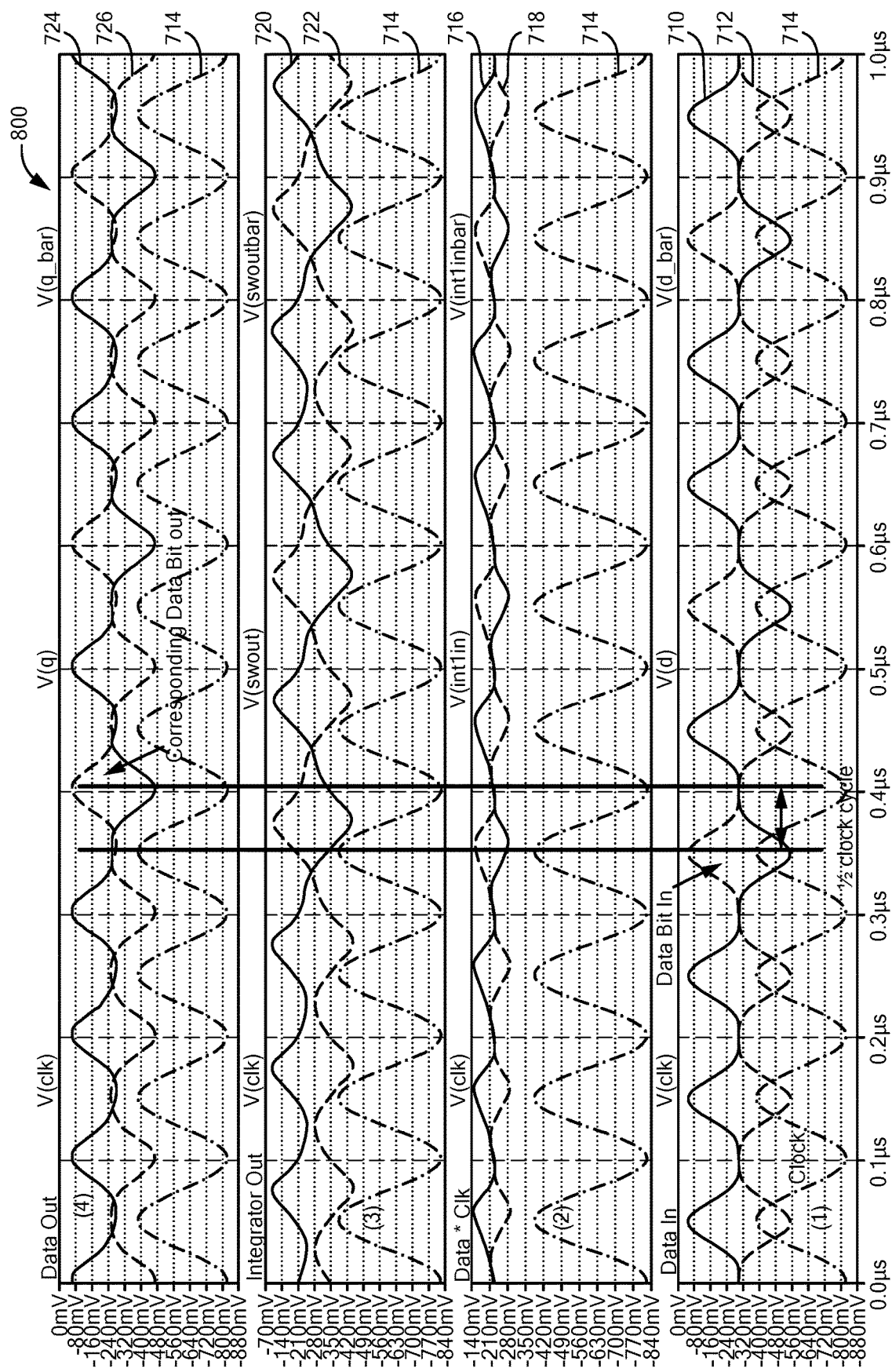
FIG. 8 is a graphical diagram showing various signals of the example sequential circuit of FIG. 6, showing the data in, data out, and clock cycle delay.

Reference is now made to FIGS. 6-8 showing an example sequential circuit 600 and graphical diagrams 700 and 800 of the various signals associated therewith, in accordance with an embodiment of the present disclosure. FIG. 6 is a block diagram showing an example sequential circuit 600 to implement the SEDL techniques of the present disclosure. FIG. 7 is a graphical diagram 700 showing various signals of the example sequential circuit of FIG. 6, showing an integrating portion and a discharging portion of the signal processing. FIG. 8 is a graphical diagram 800 showing various signals of the example sequential circuit of FIG. 6, showing the data in, data out, and clock cycle delay.

With reference to FIG. 6, the SEDL sequential device 600 assesses the state of an incoming bit on the data input 610 by integrating over a first portion of the clock period of the clock signal and then discharging over the second portion of the clock signal. The data input 610 and clock signal 612 are received at the multiplier circuit 614 of the SEDL sequential circuit 600. The multiplier circuit 614 is configured to provide a product signal corresponding to the product of the data input signal 610 multiplied the clock signal 612. An integrator circuit 616 has an input coupled to the output of the multiplier circuit 614 and an output coupled to a limit circuit 618. The integrator circuit 616 is configured to integrate the product signal over a first portion of a clock period to determine a logic state of the input signal 610. The limit circuit 618 has an input coupled to the output of the integrator circuit 616 and drives the selector 624. The pulse generator 622 receives the clock and converts it to a SEDL pulse stream. The SEDL pulse stream from the pulse generator 622 is then modulated by the selector 624. The outputs now reflect the data bit values determined by the integrator 616.

The limit circuit 618 is configured to apply limits to a state result provided to the input of the limit circuit 618 from said integrator circuit 616. The limit circuit 618 accepts the differential voltage from the integrator circuit 616. The limit circuit 618 has an internal differential voltage thresholds. Voltages outside of the thresholds are effectively limited to the threshold value. This allows for some tolerance on the input amplitude. Meaning, the input amplitude can be a little smaller or larger than nominal, and it will have no effect on the output pulses.

The SEDL sequential device 600 includes a pulse generator 622 having an input coupled to the output of the limit circuit 618 and has an output. The pulse generator 622 is configured to receive the logic state from the limit circuit 618 and to provide an output signal (i.e., discharge) over a second portion (e.g., a second-half) of the clock period at the output thereof having a spectrally-efficient shaped output signal pulse, wherein the spectrally-efficient shaped output signal pulse represents a logic value corresponding to the logic value of the input signal 610.

The integrator circuit is configured to determine the logic state of the input signal during a first portion (e.g., a first-half) of a clock period according to:

$$\text{State}(k) = \int_{t_k}^{t_k+T/2} \text{Input}(t_k) * \text{Clk}(t_k) dt$$

in which:
State(k) is the logic state of the input signal at index k;
T is the clock period;
Input($t_k$) is the value of the input signal (amplitude and phase) over the time period from t=$t_k$ to $t_k$+1; and
Clk($t_k$) is the value of the clock signal (amplitude and phase) over the time period from t=$t_k$ to
where k' is an arbitrarily assigned integer representing a particular clock cycle. i.e. Normalizing time by a clock period: the kth clock cycle is the current clock cycle k+1 is the next clock cycle, k−1 is the last clock cycle etc.

Integrating by the integrator circuit 616 over a first portion (e.g., first-half) of a clock period provides the "average" value of the bit, which is provided to the filter 618. The average is then slowly discharged over the second portion (e.g., second-half) of the clock period. The aggregate "integrate-discharge" operation reflects the logic state of the input signal. The integrated output is a differential voltage which drives the limit circuit 618 and in turn the selector 624. The integrator differential voltage value represents either a logic 0 or logic 1. The selector 624 applies either a 0 or a 1 to the pulse stream from the pulse generator 622 and sends the now modulated pulse stream to the differential output 626, 628.

Providing the determined logic state to the pulse generator 622 comprises applying limits to the state result, formulating the pulses from the incoming clock, and the output state of the integrator determines the polarity of the pulse generator output circuit.

FIG. 7 shows the various signals corresponding to the example sequential circuit of FIG. 6 and illustrates the integrating portion during a first time period T1 and the discharge portion during the second time period T2, which are used to determine the logic state of the input signal. The first time period T1 can be a first-half of the clock cycle, and the second time period T2 can be a second-half of the clock cycle. The first time period T1 and the second time period T2 do not overlap with each other and can be the same duration or one period can be longer or shorter than the other. As will be appreciated in light of the present disclosure, the state is then fed to a pulse generator arrangement 622 which generates a new pulse with every clock cycle. Limits to the state are applied to the logic state by the limit circuit 618.

The various waveforms shown in FIGS. 7 and 8 include (i) the data-in waveform 710 which can be the value input at data 610 to the multiplier circuit 614 in FIG. 6, (ii) data-in bar waveform 712, (iii) the clock signal waveform 714, (iv) the data*clock waveform 716 which can be the output of the multiplier circuit 614 of FIG. 6, (v) the data*clock bar waveform 718, (vi) the integrator output waveform 720 which can be the output of the integrator circuit 616 of FIG. 6, (vii) the integrator output bar waveform 722, (viii) the data out waveform 724 which can be Q output 626 in FIG. 6, and (ix) the data out bar waveform 726 which can be Qbar output 628 in FIG. 6.

As shown in FIG. 8, the output is delivered one-half of a clock cycle later than the input. The state is held for one clock cycle. Note that the output data 832 matches the input data 830 with a half clock cycle delay, as is similarly observed with the conventional flip-flop logic gate.

Figure 9:
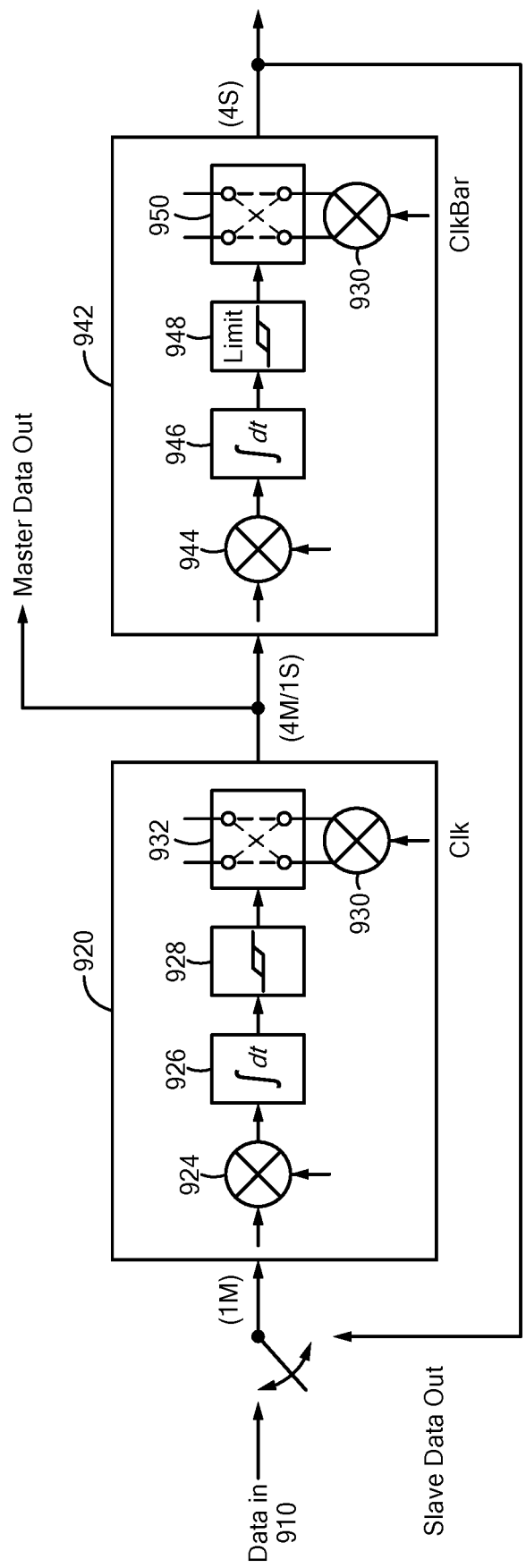
FIG. 9 is a block diagram showing an example sequential state retention circuit having a master flip-flop and a slave flip-flop.
Figure 10:
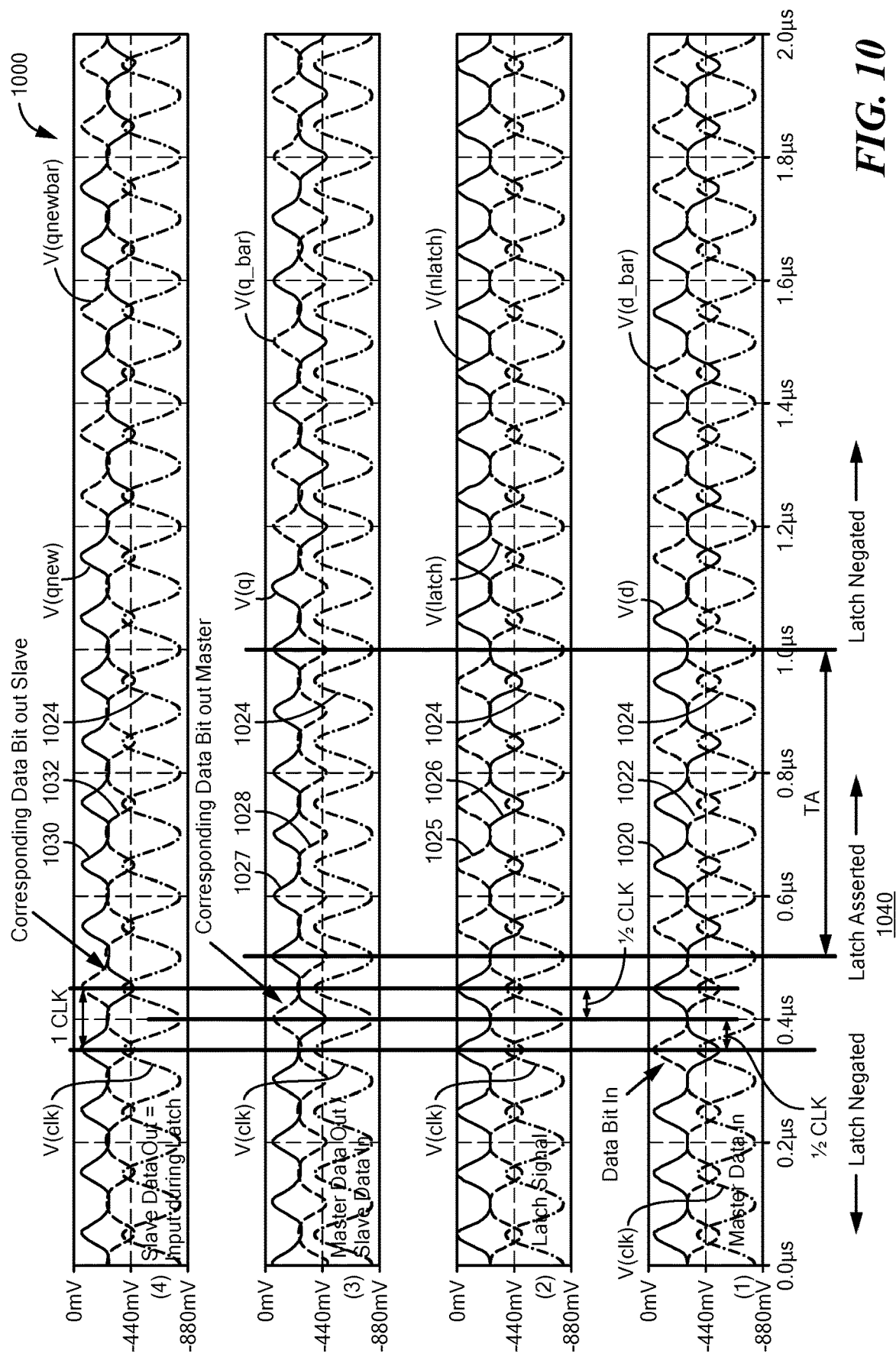
FIG. 10 is a graphical diagram showing the waveforms of the example sequential state retention circuit of FIG. 9.

Reference is now made to FIGS. 9-10 showing an example sequential state retention circuit 900 and a graphical diagram 1000 of the corresponding various input and output waveforms, according to an embodiment of the present disclosure. FIG. 9 is a block diagram 900 showing an example sequential state retention circuit having a master flip-flop and a slave flip-flop. FIG. 10 is a graphical diagram 1000 showing the waveforms of the D flip-flop circuit.

As shown in FIG. 9, a state retention device 900 is provided by using two D flip-flops in a master-slave arrangement and implementing the spectrally-efficient techniques of the present disclosure. As will be appreciated upon reading the present disclosure, to implement the spectrally-efficient pulses, each flip-flop 920, 942 includes, respectively, a multiplier circuit 924, 944; an integrator circuit 926, 946; a limit circuit 928, 948; and a pulse generator/selector arrangement 930/932, 910/942. A conventional D-type flip-flop typically holds a state for one clock cycle and is capable of holding the state indefinitely. SEDL flip-flops can also hold the state indefinitely.

The input of the first (master) flip-flop 920 can be switched from new data 910 to the output of the second (slave) flip-flop 942 for previously read data. The state can now be held indefinitely by including the second flip-flop. When the master 920 is listening to the slave 942, it holds the save until the master 920 is switched back to listening to data input 910. Operating a device whose input is listening to its output can often create stability issues. The integration and regeneration topology used with the spectrally-efficient techniques of the present disclosure facilitates indefinite state retention, without producing a stability problem. The integrate/regenerate topology:

$$\text{State}(k) = \int_{t_k}^{t_k+T/2} \text{Input}(t) * \text{Clk}(t) dt$$

$$\text{GPdataOut} = \text{Limit}[\text{State}(k)] * \{\cos(2*pi*f) + 1\}^2$$

The matched filter output is "limited" (by the limit circuit 928) before driving the pulse generator which, in effect, holds the poles of the system on the jw axis at the clock frequency. The poles do not lie in either the right or left half plane which would cause an exponential increase or decay of the data being held indefinitely.

As shown in FIG. 10, the logic state can be saved for on clock cycle within a flip flop. The output is one-half clock cycle delayed from the input. A second flip-flop (slave) 942 can be attached to the output of the master 920. This saves the data for another clock cycle. The data out of the master 920 is delayed by one-half of a clock cycle with respect to its input 910. The data out of the slave 942 is delayed by one-half of a clock cycle with respect to its input, which is 1 full clock cycle delayed with respect to the Master input. The slave output is in phase with the master data in 910, but with a full clock cycle of delay. The output of the slave is 1 clock cycle delayed from the input of Master flip-flop 920.

The various waveforms shown in FIG. 10 include (i) the data-in waveform 1020 which can be the value input at data 910 to the multiplier circuit 914 of FIG. 9, (ii) the data-in bar waveform 1022, (iii) the clock signal waveform 1024 which can be the clock (clk) of FIG. 9, (iv) the latch waveform 1025 which can be latch command controlling the data in 910 of FIG. 9, (v) the latch bar waveform 1026, (vi) the master data out/salve data in waveform 1027 which can be the output of the pulse generator 930 and selector 932 as well as the input to the multiplier circuit 944 of the second flip-flop 942, (vii) the master data out/slave data in bar waveform 1038, (viii) the slave data out waveform 1030 which can be the Q output of pulse generator 940 and selector 950 of the slave flip-flop 942, and (ix) the slave data out bar waveform 1030, which can be the Q bar output of the pulse generator 940 and selector 950 of the slave flip-flop 942 of FIG. 9. When the latch command is asserted 1040, the master input waveform 1020 is fed by the salve output waveform 1030, and whatever logic state is present at the output is held for as long as the latch remains asserted (period "TA").

Figure 11:
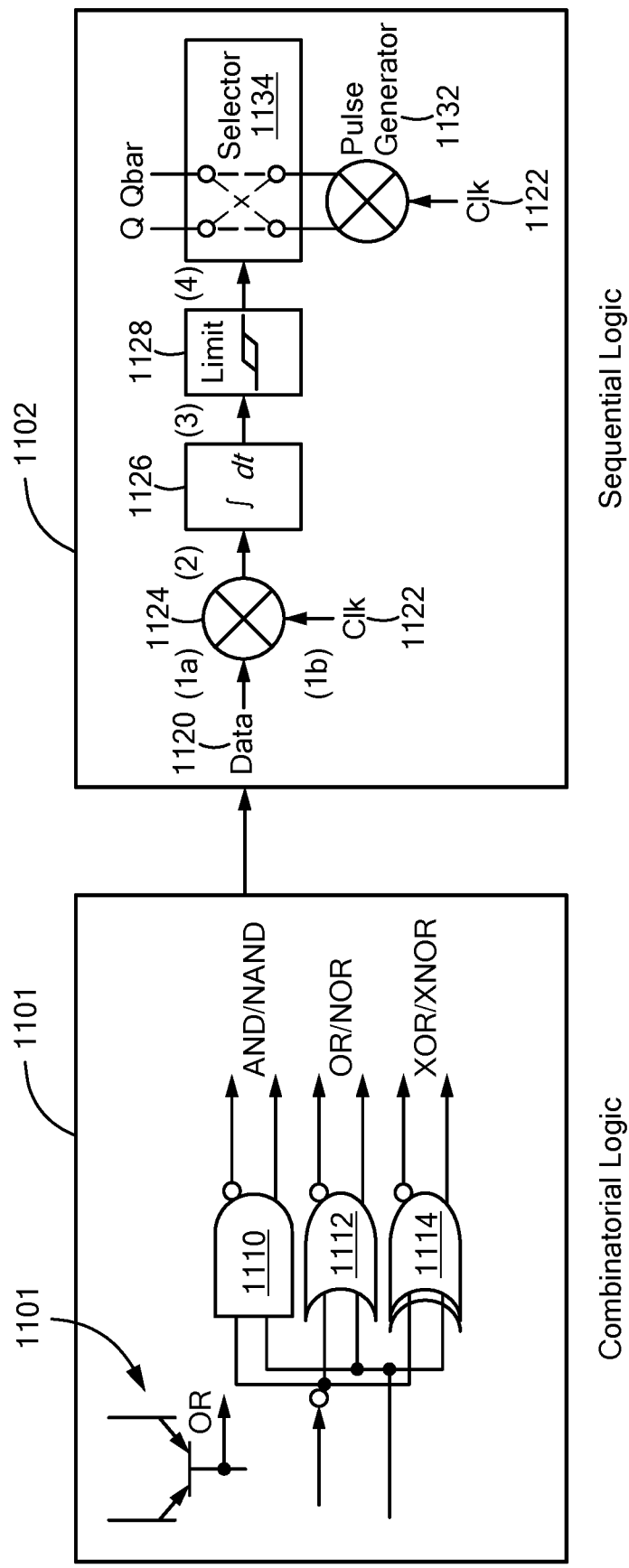
FIG. 11 is a block diagram showing a combined circuit including both combinatorial logic elements and sequential logic elements, using the SEDL techniques in accordance with the present disclosure.

FIG. 11 is a block diagram showing a circuit including combinatorial logic and sequential logic, and operable using the SEDL techniques in accordance with the present disclosure. It will be appreciated in light of the present disclosure that the SEDL techniques can be implemented in combinatorial logic circuits and in sequential logic circuits, as well as in circuits having both combinatorial logic and sequential logic, as shown in FIG. 11. As shown, the combinatorial logic circuit 1101 includes a AND/NAND gate 1110, OR/NOR gate 1112, and XOR/XNOR gate 1114. Using the spectrally-efficient waveforms of the present disclosure, the output of any of the appropriate gates 1110, 1112, or 1114 can be input as data to the sequential circuit 1102. The sequential circuit 1102 is similar to those described herein, including a multiplier circuit that multiplies the data-in 1120 by the clock 1122, an integrator circuit 1126, a limit circuit 1128, a pulse generator 1132 and a selector 1134 to select between Q 1136 and Qbar 1138.

As is known, combinatorial circuits implement Boolean functions and are functions of their inputs only and are not based on clocks or states, whereas sequential circuits compute their output based on the output and the state, with the state being updated based on a clock input. Thus, the sequential circuits have state and memory, whereas the combinatorial circuits do not have state or memory.

It will be appreciated upon reading the present disclosure that the spectrally efficient techniques assume that the shortest data pulse is one clock cycle wide. Meaning, the fastest data transition is not longer than one clock cycle.

The spectrally efficient techniques described herein find use in a variety of systems and methods, including but not limited to an analog-to-digital converter (ADC) and a digital-to-analog converter (DAC), for example.

In accordance with DAC spectrally-efficient devices and techniques, a spectrally-efficient pulse representative of a digital value is received and an analog value (e.g., an analog voltage level) is output by the DAC circuit. Refer, for example, to FIGS. 12-19 showing example spectrally-efficient DAC circuits and techniques.

Figure 20:
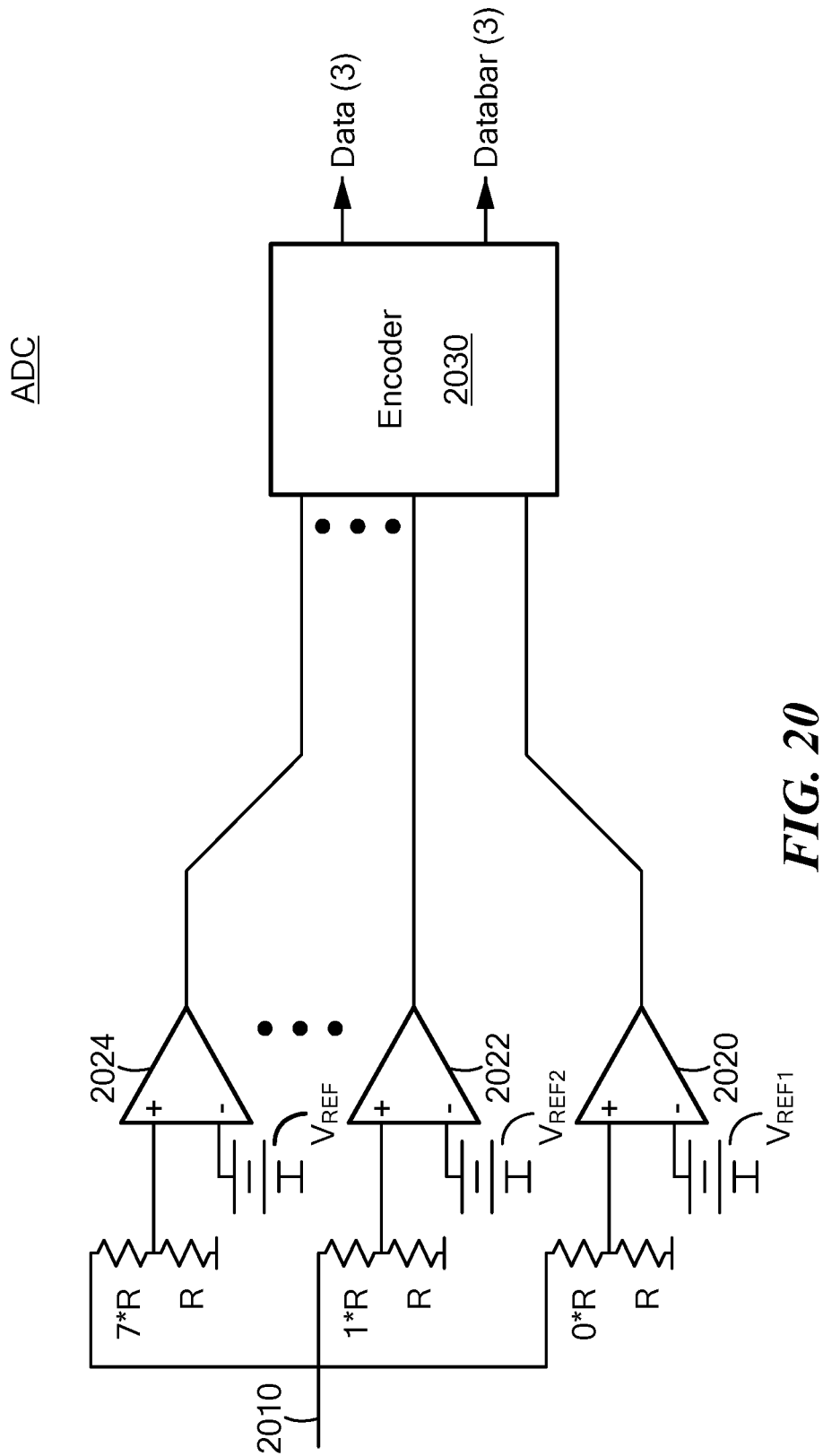
FIG. 20 is a block diagram of a portion of a SEDL ADC circuit including a plurality of comparators and an encoder, and three data bits output by the encoder.
Figure 21:
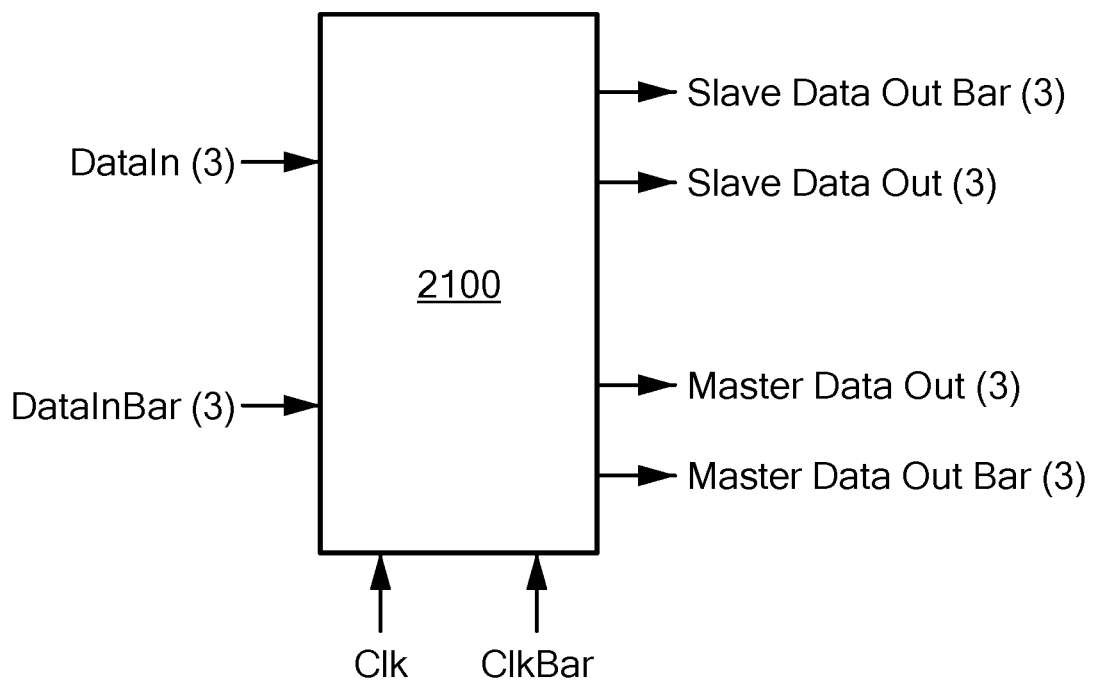
FIG. 21 is a block diagram of a portion of the SEDL ADC that is coupled to receive and responsive to the data output by the encoder.

In accordance with ADC spectrally efficient devices and techniques, an analog value is input and a digital value represented by a spectrally-efficient shaped pulse is output by the ADC circuit. Refer, for example, to FIGS. 20-22 showing example spectrally-efficient ADC circuits and techniques.

Figure 12:
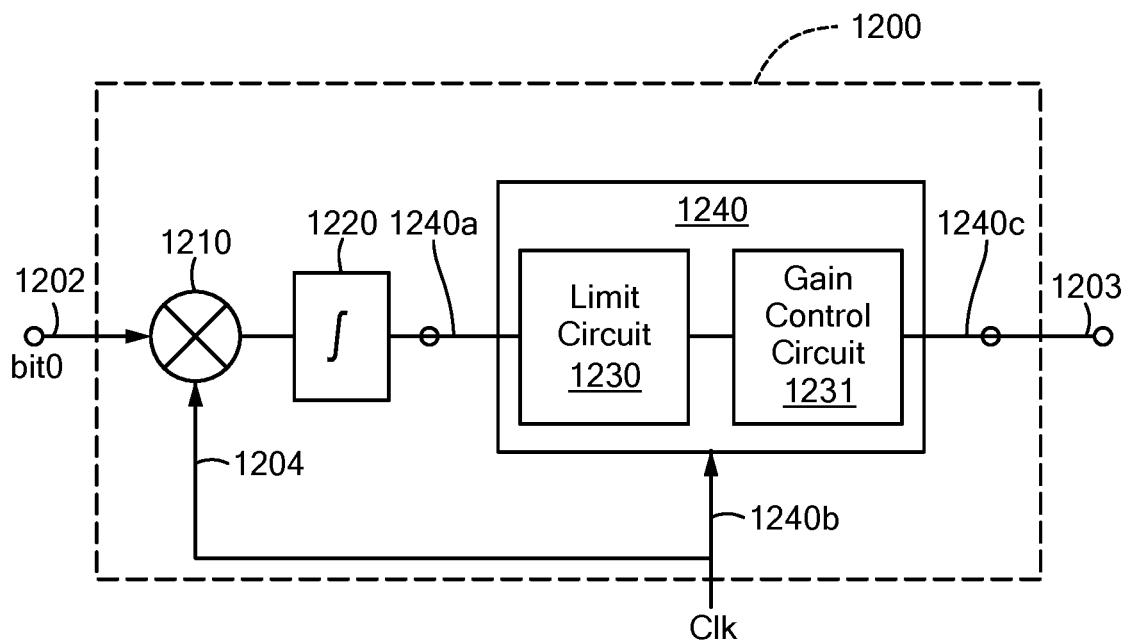
FIG. 12 is a block diagram showing an example SEDL DAC circuit including a clocked comparator circuit.

Referring now to FIG. 12, an example of a portion of a SEDL DAC circuit (i.e. a spectrally-efficient circuit 1200) includes a clocked comparator circuit 1240. Spectrally-efficient circuit 1200 may also be referred to herein as a SEDL D flip-flop 1200. SEDL D flip-flop 1200 receives data input at 1202. The data input signal corresponds to a spectrally efficient digital pulse (i.e., a SEDL pulse) which may represent, for example, a data bit (here designated as "bit0").

The SEDL pulse is provided to a first input 1210a of a multiplier circuit 1210 and a clock signal CLK is provided to a second input 1210b of the multiplier circuit. The clock signal may, for example, be provided as a sinewave, or un-modulated SEDL pulses.

In response to the data and clock signals provided thereto, multiplier 1210 generates a product signal which is provided to an input of an integrator circuit 1220. The product of the clock and the input SEDL data pulse is effectively a measure of their intersection in time. The output of the multiplier (i.e. the product signal) is an instantaneous measure of the alikeness of the two signals (i.e. a measure of the alikeness of the two signals at each instant in time). The product signal can be integrated over some portion of a period. Such integration may help reduce, and ideally avoid errors caused by noise in the signals being processed. In an embodiment, the integration may be performed over one-half (½) of a clock cycle. Integrating (or accumulating) over one-half of a clock cycle may produce a signal which is positive (and ideally very positive) or negative (and ideally very negative). The clock drives the flip-flop integration operation in the sense that the integrator integrates the input signal for a portion of the clock period (e.g. one-half of the clock period) and discharges for the remainder of the clock period. Since the clock controls when the integrator is integrating, the amount of the input signal present when the clock is in the integration phase is a measure of the signal strength. Stated differently, the product or intersection of the input signal and the clock is a measure of how much of the input signal is present during the integration period. Integrating this value over time to determine the bit's logic value, 0 or 1, is part of the matched filter approach.

Integrator circuit 1220 has an input configured to receive a plurality of spectrally-efficient shaped digital logic (SEDL) pulses from multiplier 1210, with each SEDL pulse representing one or more bits of the input signal. The integrator circuit is configured to integrate the product signals provided thereto and determine a logic state represented by each of the plurality of SEDL pulses. In embodiments, integrator circuit 1220 produces a differential output voltage. The differential output voltage from the integrator reflects the logic state. If the output signal is more positive than its compliment, the logic state is 1. If the compliment is more positive than the signal, the logic state is 0.

The differential output voltage of the integrator 1220 is coupled to a first input 1240a of a clocked comparator circuit 1240 and a clock signal CLK is provided to a second input 1240b of the clocked comparator 1240.

Clocked comparator circuit 1240 includes at least limit and gain control circuitry 1230, 1231 which process the signals provided thereto (i.e. applies limits and implements amplitude scaling) to generate analog signals having voltage levels within a certain range at an output 1240c thereof. The clocked comparator output 1240c is coupled to the output 1203 of SEDL D flip-flop 1200. In this way, SEDL D flip-flop 1200 receives a SEDL pulse at an input 1202 thereof and provides a corresponding analog signal at an output 1203 thereof.

Figure 12A:
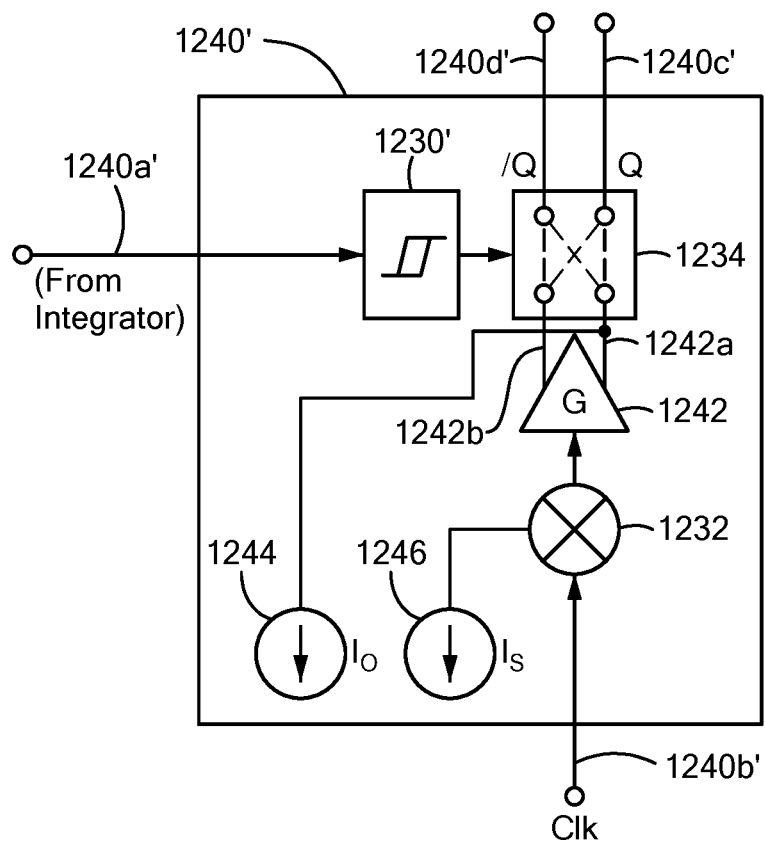
FIG. 12A is a block diagram of a clocked comparator circuit which may be the same as or similar to the clocked comparator of FIG. 12 in greater detail.

The generation of a scaled SEDL signal will be described below in conjunction with a clocked comparator circuit as shown in FIG. 12A. It should be noted that the clocked comparator circuit of FIG. 12A includes clocked comparator circuit output 1240c (illustrated as signal Q in FIG. 12A) as well as a second output 1240d at which the complement of signal Q (i.e. the "bar" signal illustrated as signal output "/Q" in FIG. 12A). Thus two outputs are shown in FIG. 12A (as compared with a single output being shown in FIG. 12).

Referring now to, FIG. 12A, an illustrative clocked comparator circuit 1240' suitable for use in a SEDL D flip-flop, such as the SEDL D flip-flop of FIG. 12 for example, includes a limit circuit 1230' (which may be the same as or similar to limit circuit 1230 in FIG. 12) configured to receive an input signal from an integrator at input 1240a'. An output of integrator 1230' is coupled to a first input of a selector circuit 1234.

Clocked comparator circuit 1240' also receives a clock signal CLK at a second input 1240b' which is coupled to an input of multiplier circuit 1232.

In response to the clock signal CLK provided thereto, multiplier circuit 1232 provides pulses to the input 1242a of a gain circuit (e.g. an amplifier) 1242 having differential outputs 1242b, 1242c.

The differential outputs 1242b, 1242c of gain circuit 1242 are coupled to respective ones of a pair of inputs of selector circuit 1234. A signal current source circuit 1246 is coupled to a second input of multiplier circuit 1232 and an offset current source circuit 1244 is coupled output 1242a of gain circuit 1242. The offset current source and signal current source circuits 1244, 1246 function to set the amplitude of the scaled SEDL pulse output provided by clocked comparator circuit 1240'. In particular, pulses come in from the pulse generator at a fixed amplitude. Transistors Q1,Q2 along with R1,R3,R6,R7 form a differential amplifier producing positive going and negative going pulses. The ratio of—−R1/R6 and −R3/R7 sets the gain. R1, R3 are fixed (for example, a 50 ohm system). Gain can be adjusted by R6,R7 to scale the outgoing SEDL pulses. Scaling the gain and hence the amplitude of the SEDL pulses into fixed load resistors R1,R3 also changes the signal and offset currents required. The signal current can be increased by decreasing R5. The offset current can be increased by decreasing R4.

The SEDL techniques can be applicable to a single bit as well as to a plurality of bits. For example, a three-bit input signal may be used with one bit provided to each SEDL circuit, and each SEDL circuit having a different gain control circuit, offset current source circuit, and signal current source circuit, as shown in FIG. 13, for example.

As will be appreciated in light of the present disclosure, the SEDL clocked comparator can be used for both DACs and ADCs.

Figure 13:
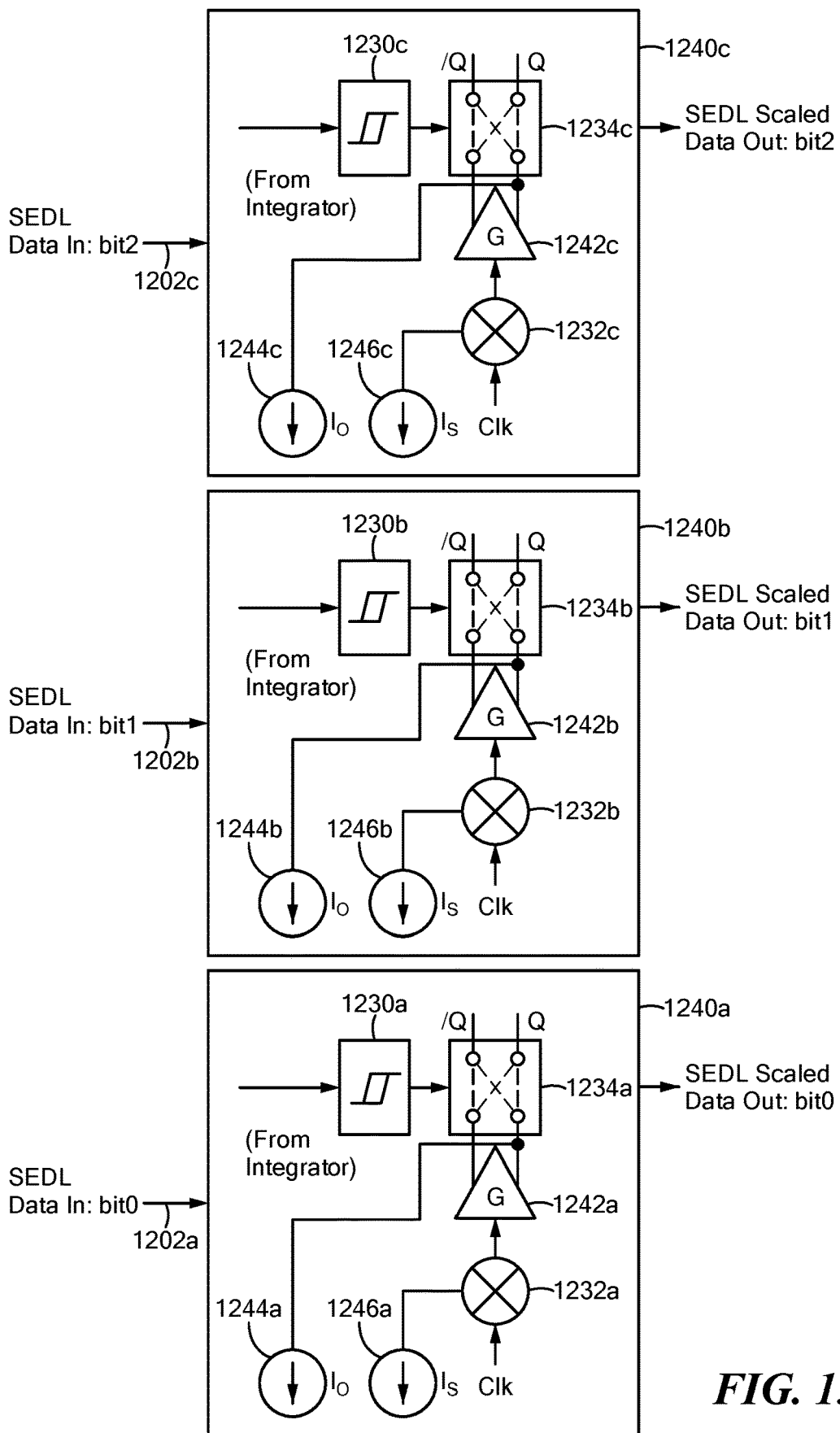
FIG. 13 is a block diagram showing an example three-bit SEDL DAC circuit.

Referring now to FIG. 13, an example three-bit SEDL DAC circuit includes a first clocked comparator circuit 1240a configured to receive a first data bit input 1202a ("bit0"), a second clocked comparator circuit 1240b configured to receive a second data bit "bit1" input 1202b("bit1"), and a third clocked comparator circuit 1240c for the third data bit input 1202c ("bit2"). The first clocked comparator circuit 1240a includes a limit circuit 1230a, a first pulse generator 1232a, a gain control circuit 1242a, an offset current source circuit 1244a, and a signal current source circuit 1246a.

The second clocked comparator circuit 1240b includes a limit circuit 1230b, a second pulse generator 1232b, a gain control circuit 1242b, an offset current source circuit 1244b, and a signal current source circuit 1246b. The second clocked comparator circuit 1240b has an input coupled to the output of the integrator circuit and is configured to receive a logic state of at least a second input pulse of the input signal, and to provide a second scaled spectrally-efficient shaped pulse representative of the second input pulse (bit1). A second amplitude of the second scaled spectrally-efficient shaped pulse is set by a second gain circuit, a second offset current source, and a second signal current source of the second clocked comparator circuit coupled to the second pulse generator, the second amplitude being different than the first amplitude.

The third clocked comparator circuit 1240c includes a limit circuit 1230c, a third pulse generator 1232c, a gain control circuit 1242c, an offset current source circuit 1244c, and a signal current source circuit 1246c. The third clocked comparator circuit 1240c has an input coupled to the output of the integrator circuit and is configured to receive a logic state of at least a third input pulse of the input signal, and to provide a third scaled spectrally-efficient shaped pulse representative of the third input pulse (bit2). A third amplitude of the third scaled spectrally-efficient shaped pulse is set by a third gain circuit, a third offset current source, and a third signal current source of a third clocked comparator circuit coupled to the third pulse generator. The third amplitude is different than the first amplitude and the second amplitude. In this manner, the first clocked comparator 1240a provides a scaled output having a first amplitude, the second clocked comparator 1240b provides a scaled output having a second amplitude that is approximately double the first amplitude, and the third clocked comparator 1240c provides a scaled output having a third amplitude that is approximately double the second amplitude. Accordingly, by determining the amplitude of the output, the corresponding bit value can be determined.

Figure 13A:
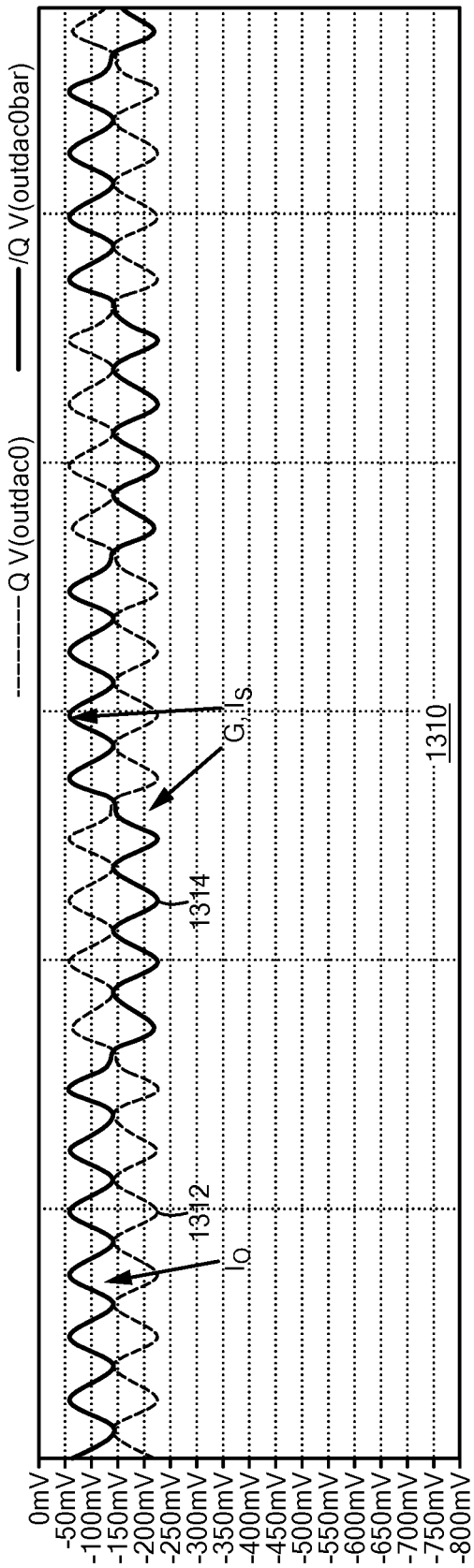
FIG. 13A is a plot of voltage vs. time showing a scaled SEDL output for the first bit ("bit0") of the input SEDL data.

FIG. 13A is a graph showing a scaled SEDL output for the first bit ("bit0") of the input SEDL data. Graph 1310 is representative of the scaled data output of the first bit (bit0) clocked comparator circuit 1240a. The gain 1242a, the offset current 1244a, and the signal current 1246a of the clocked comparator circuit 1240a determines an amplitude of the scaled SEDL pulses 1312, 1314. Note that the Q signal 1312 and the Q bar signal (denoted/Q) 1314 are both shown in the graph 1310. The gain G sets the size of the SEDL signal. This will only work properly if the signal current is scaled to support the amplitude of the SEDL signal across a fixed load. The amplitude of the scaled SEDL waveform is set by G and Is, the signal current. Where the positive going pulses meet the negative going pulses (as shown, in the middle) is set by Io, the offset current, as shown.

Figure 13B:
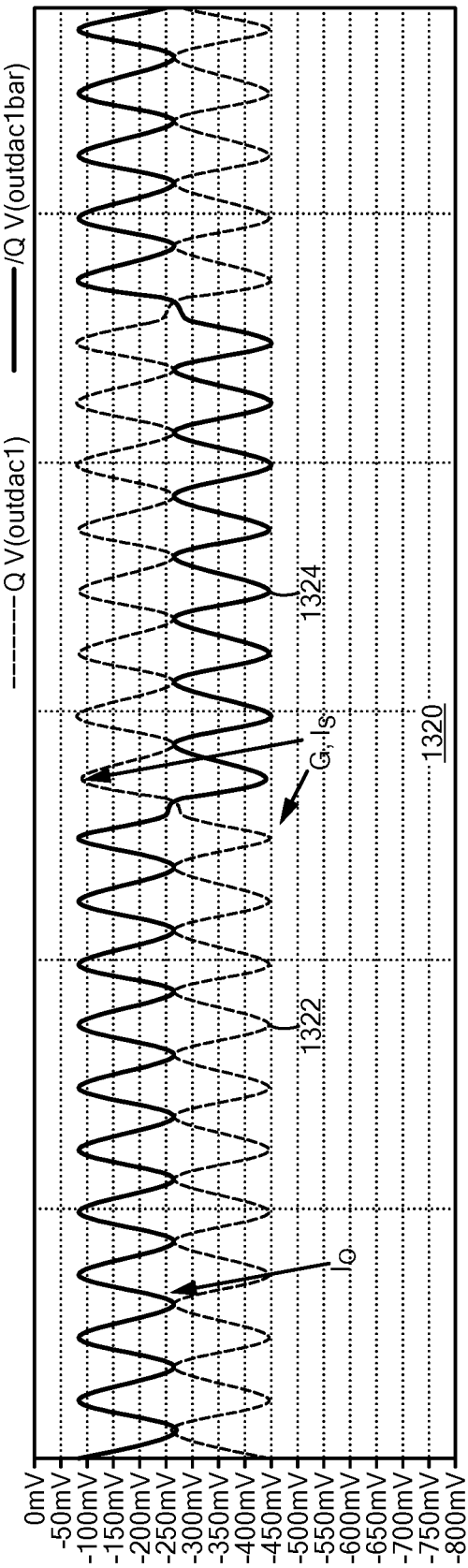
FIG. 13B is a plot of voltage vs. time showing a scaled SEDL output for the second bit ("bit1") of the input SEDL data.

FIG. 13B is a graph showing a scaled SEDL output for the second bit ("bit1") of the input SEDL data. FIG. 13B shows graph 1320 representative of the scaled data output of the second bit (bit1) clocked comparator circuit 1240b. The gain 1242b, the offset current 1244b, and the signal current 1246b of the clocked comparator circuit 1240b determined an amplitude of the scaled SEDL pulses 1322, 1324. Note that the amplitude of the scaled SEDL pulses in graph 1320 are approximately double the amplitude of the scaled SEDL pulses in graph 1310. Accordingly, a bit value for the second bit (bit1) will have a different amplitude (and, thus, different value) than a bit value for the first bit (bit0). The offset current signal Io can be used to set the offset for the scaled SEDL pulses.

Figure 13C:
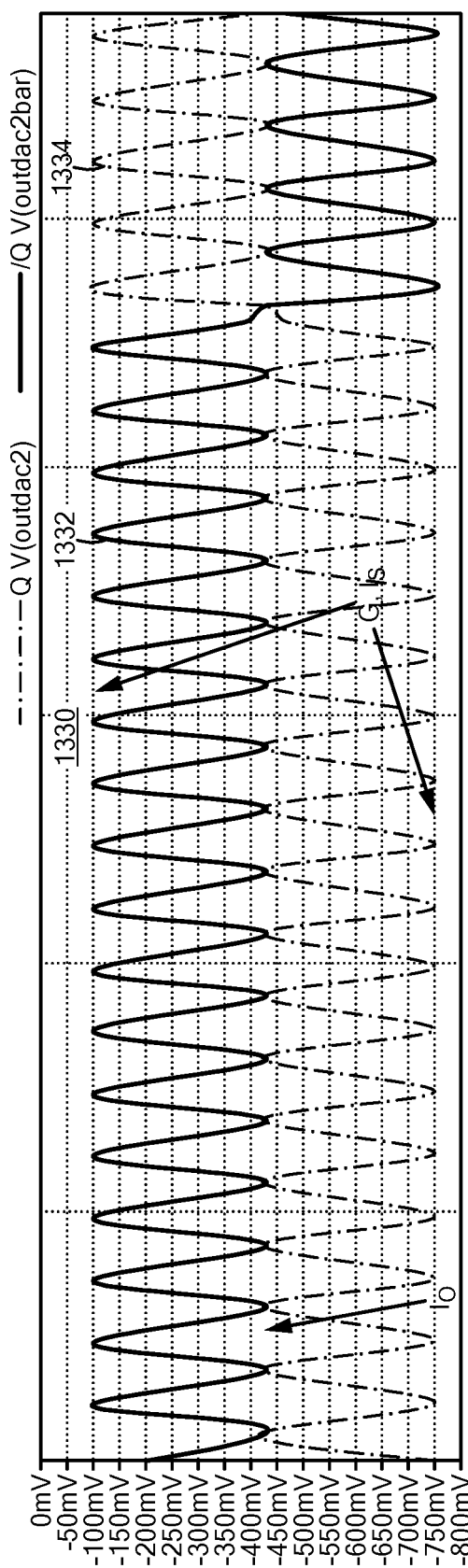
FIG. 13C is a plot of voltage vs. time showing a scaled SEDL output for the third bit ("bit2") of the input SEDL data.

FIG. 13C is a graph showing a scaled SEDL output for the third bit ("bit2") of the input SEDL data. FIG. 13C shows graph 1330 representative of the scaled data output of the third bit (bit2) clocked comparator circuit 1240c. The gain 1242c, the offset current 1244c, and the signal current 1246c of the clocked comparator circuit 1240c determine an amplitude of the scaled SEDL pulses 1332, 1334. Note that the amplitude of the scaled SEDL pulses in graph 1330 are approximately double the amplitude of the scaled SEDL pulses in graph 1320. Accordingly, a bit value for the for the third bit (bit2) will have a different amplitude (and, thus, different value) than a bit value for the second bit (bit1) and also different for the first bit (bit0). The offset current signal can be used to set the offset for the scaled SEDL pulses.

Figure 14:
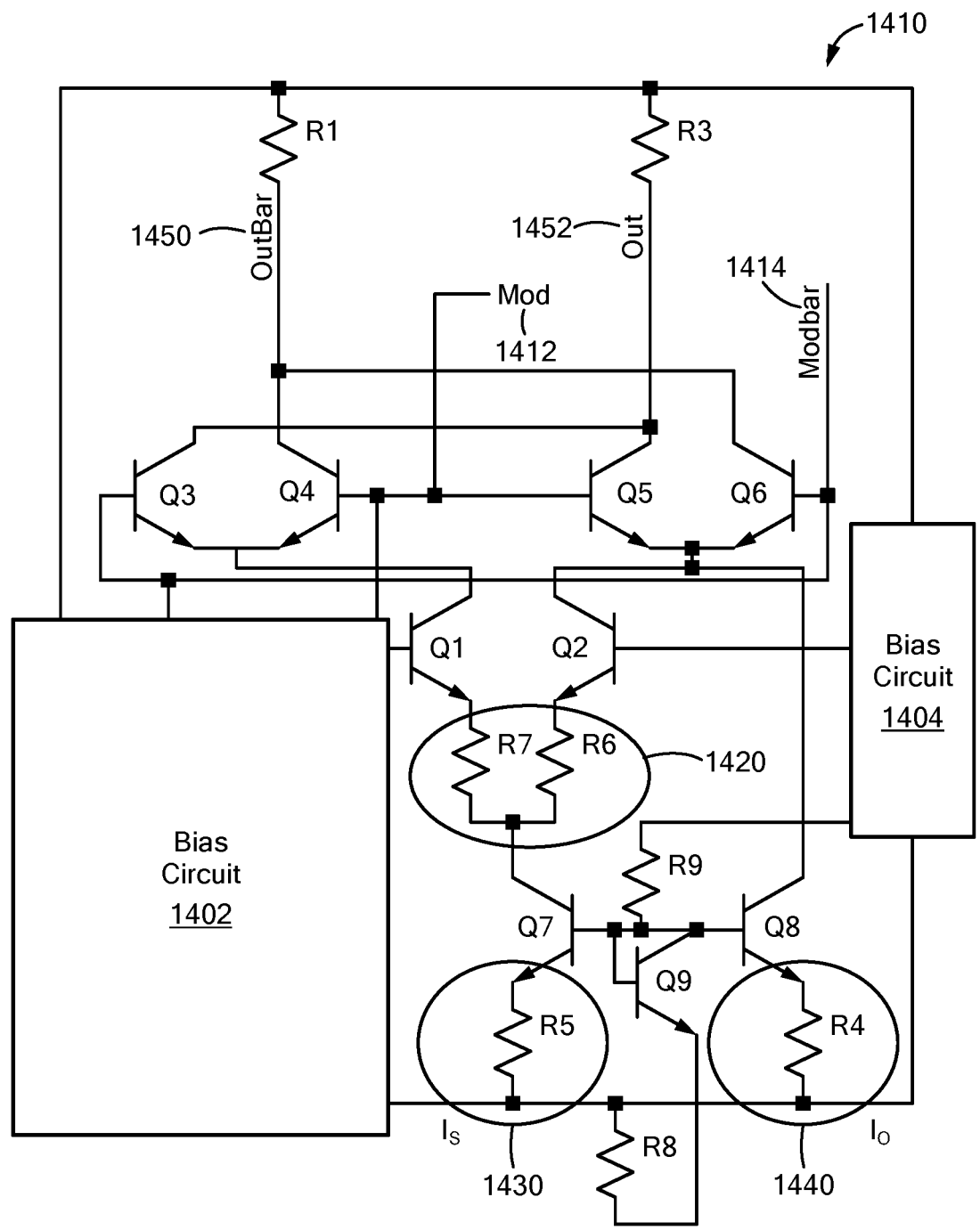
FIG. 14 is a schematic diagram of a clocked comparator circuit.

Referring now to FIG. 14 a clocked comparator which may be functionally the same as or similar to the clocked comparator circuits 1240, 1240', 1240a, 1240b, or 1240c shown in FIGS. 12, 12A and 13, is configured to receive input signals (here denoted as "Mod" and "Modbar") at input ports 1412, 1414. Input 1412 is coupled to base terminals of respective ones of transistors Q4, Q5 while input 1414 is coupled to base terminals of respective ones of transistors Q3, Q6.

A collector terminal of transistor Q3 is coupled to a collector terminal of transistor Q5 and to an output 1452. Similarly, a collector terminal of transistor Q4 is coupled to a collector terminal of transistor Q6 and to an output 1450.

An emitter terminal of transistor Q3 is coupled to an emitter terminal of transistor Q4. Similarly, an emitter terminal of transistor Q5 is coupled to an emitter terminal of transistor Q6.

Emitter terminals of transistor Q3, Q4 are further coupled to a collector terminal of transistor Q1 while emitter terminals of transistor Q5, Q6 are further coupled to a collector terminal of transistor Q2. The emitters of transistors Q1, Q2 are coupled to a collector of a transistor Q7 through respective ones of resistors R6, R7. The emitter of transistor Q7 is coupled through resistor R5 to the negative supply rail.

A base terminal of transistor Q7 is coupled to base terminals of transistors Q8, Q9. The collector of Q9 is also coupled to its own base. Emitters of transistors Q8, Q9 are coupled through respective ones of resistor R4, R8 to the bias circuit 1402 as well as to a pulse generator 1404 at the negative supply rail.

The bias circuit 1402 thus supplies bias signals to the base terminals of transistors Q1 and Q3-Q6. While the pulse generator 1404 supplies pulses to the base terminals of transistors Q2 and Q7-Q9.

At least resistors R6 and R7 set or control the gain of circuit clocked comparator circuit 1410. Thus, resistors R6 and R7 can be considered as part of a gain circuit (or gain control circuit) 1420 included as part of clocked comparator circuit. The resistors R6, R7 may be provided having the same value such as 25 Ohms. The gain circuit 1420 can be functionally the same as or substantially similar to the gain circuits 1242, 1242a, 1242b, and 1242c disclosed herein.

Resistor R5 forms a portion of a signal current source 1430. Resistor R5 can have a different value compared to the resistors of the gain circuit 1420. The signal current source 1430 can be the same as or substantially similar to the current signal sources 1244, 1244a, 1244b, and 1244c disclosed herein. Signal current source 1430 can have a resistor R5 which may be, for example, 45 Ohms.

An offset current source 1440 can comprise a fourth resistor R4 which can have a different value compared to the resistors of the gain circuit 1420 and the resistor of the signal current source 1430. The offset current source 1440 can be the same as or substantially similar to the offset current sources 11246, 1246a, 1246b, and 1246c disclosed herein. The input is provided at mod input 1412 and the complimentary input signal is provided at mod bar input 1414. The outputs are provided at output bar 1450 and output 1452.

The pulse generator 1402 provides the SEDL pulses to the gain circuit 1420. Bias circuit 1404 provides a bias signal; (e.g. a bias voltage) to the gain circuit 1420, to the offset current source 1440, and to the signal current source 1430. Before using in a DAC arrangement, the collector of Q3 is disconnected from Q6 and connected to the positive supply rail through a resistor of same value as R1. The Collector of Q3 is labelled OutX. Similarly, the collector of Q6 is disconnected from Q4 and tied to the positive supply rail through a resistor of same value as R3. The collector of Q6 is labelled OutBarX.

Pulses are received from the pulse generator 1404 at a fixed amplitude. Transistors Q1, Q2 along with resistors R1, R3, R6, R7 form a differential amplifier producing positive going and negative going pulses. Transistors Q3-Q6 form a multiplexer which steers the positive going pulses to Out or OutBar based on the signals provided by the integrator, present on Mod and ModBar. The negative going pulses are steered to the opposite output (OutBar or Out). Transistors Q7 and R5 determine the signal current (which may be referred to herein as "Is"). Transistors Q8 and R4 determine the offset current (which may be referred to herein as "Io").

Figure 15:
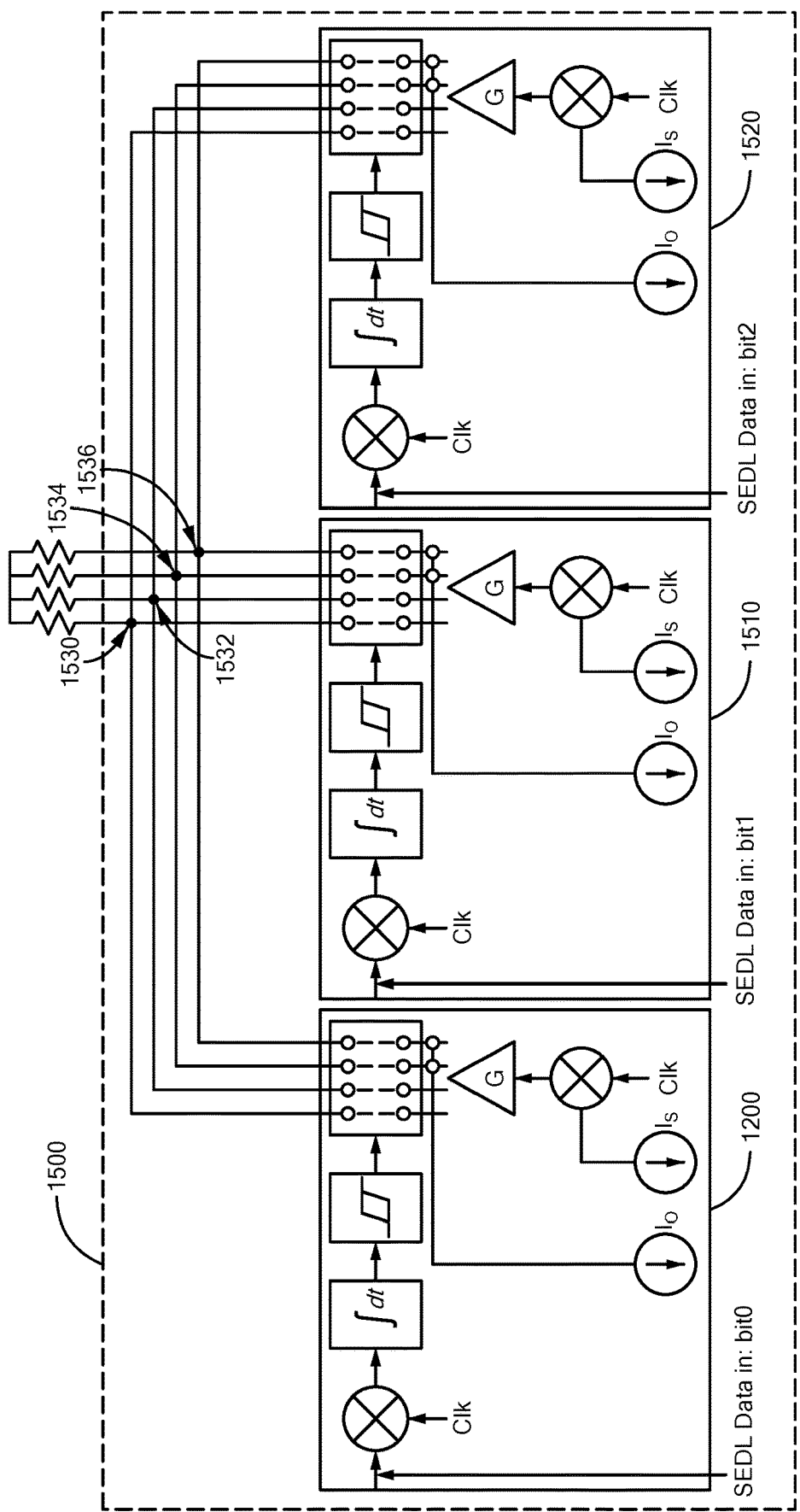
FIG. 15 is a block diagram of a three-bit SEDL flip-flop of the SEDL DAC circuit.

FIG. 15 is a block diagram of a three-bit SEDL flip-flop appropriate for use in a SEDL DAC circuit such as the SEDL DAC circuit of FIG. 13, for example. The details of coupling together the outputs of each SEDL circuit are shown in FIG. 15. The overall circuit 1500 includes the first SEDL circuit 1200 for processing a first bit (bit0), the second SEDL circuit 1510 for processing a second bit (bit1), and the third SEDL circuit 1520 for processing a third bit (bit2). Outputs of the first, second and third SEDL circuits 1200, 1510, 1520 are coupled together as shown in FIG. 15.

The "OutX" output for each of the SEDL circuits 1200, 1510, 1520 are tied together at 1530, the "OutBar" output for each of the SEDL circuits 1200, 1510, 1520 are tied together at 1532, the "Out" output for each of the SEDL circuits 1200, 1510, 1520 are tied together at 1534, and the "OutBarX" output for each of the SEDL circuits 1200, 1510, 1520 are tied together at 1536.

Figure 15A:
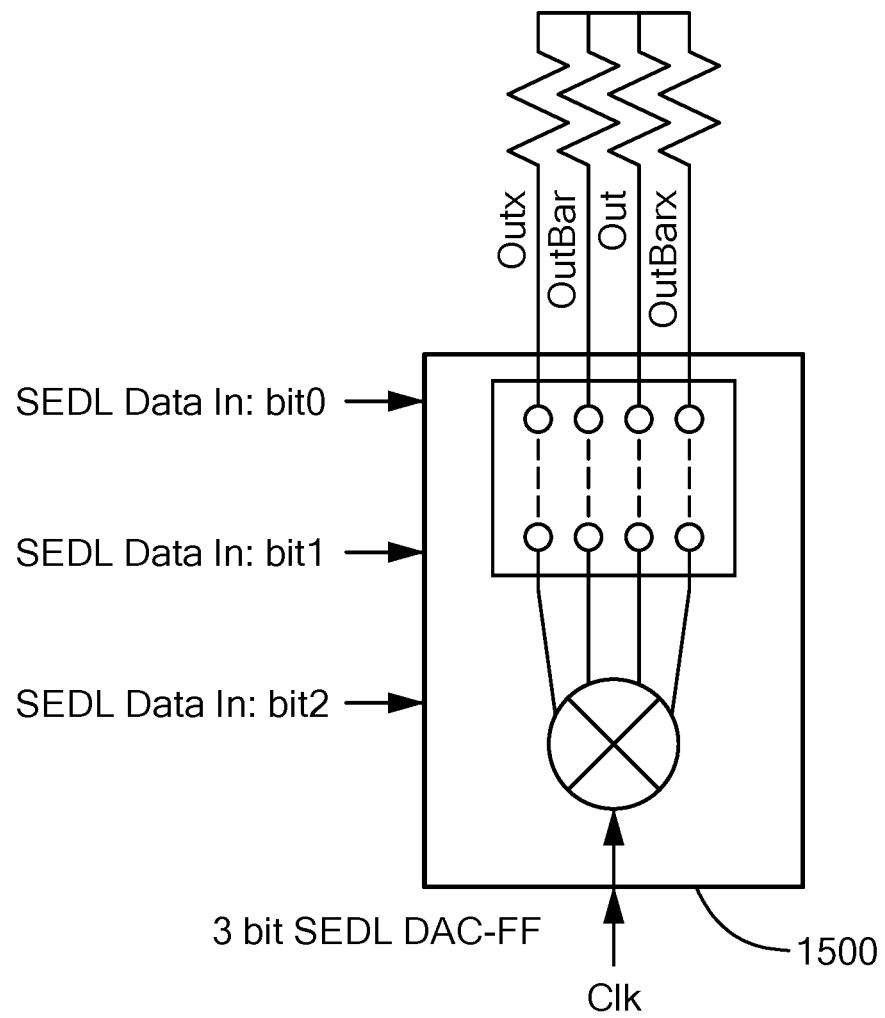
FIG. 15A is a simplified symbol to illustrate the three-bit SEDL flop-flop of FIG. 15.

FIG. 15A shows a simplified symbol to illustrate the three-bit SEDL flop-flop circuit 1500 of FIG. 15. The three-bit SEDL flip-flop circuit 1500 receives three SEDL data bits as the input signal (as a plurality of SEDL pulses) and the scaled SEDL pulses are output as signals designated as OutX, OutBar, Out, OutBarX.

Figure 16:
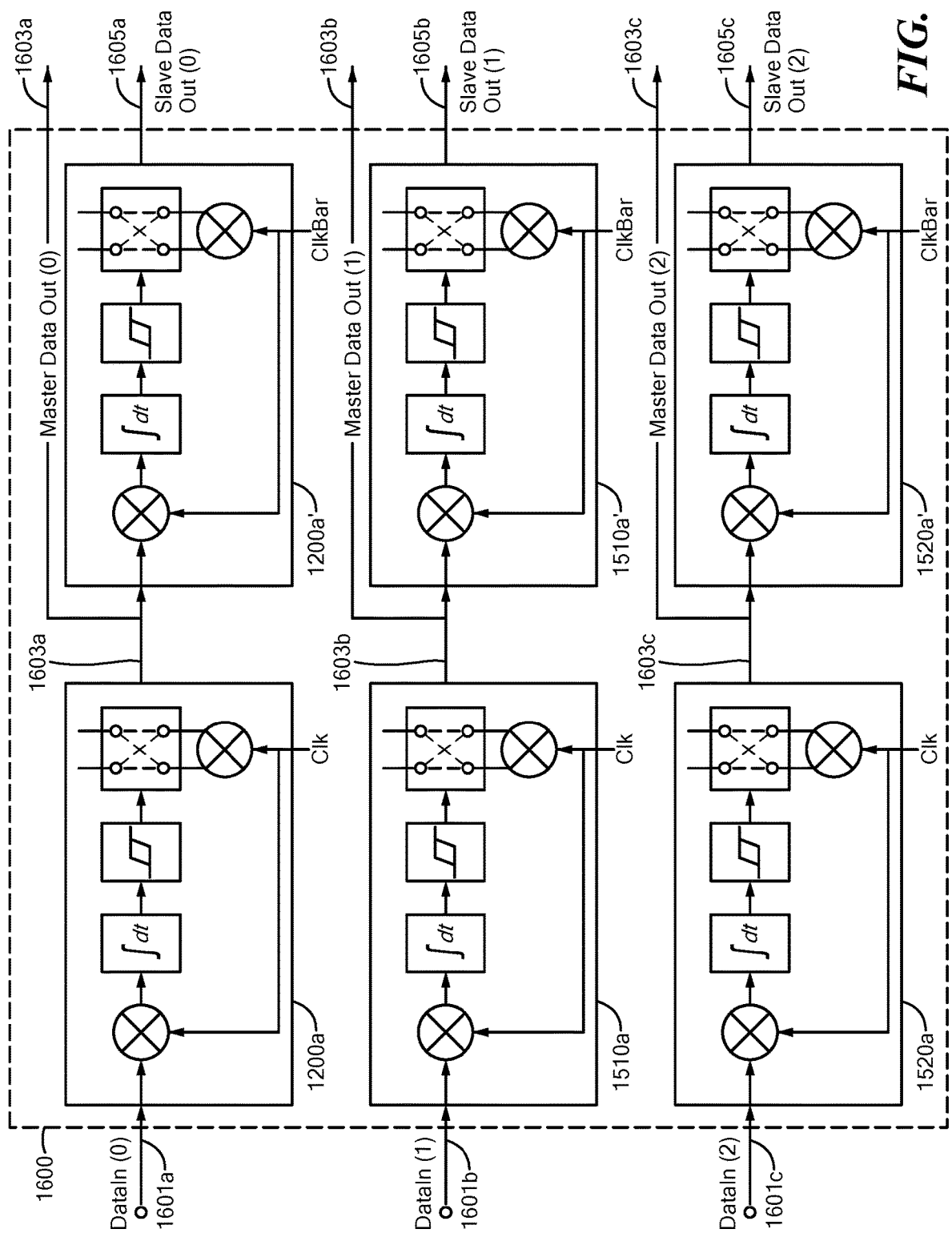
FIG. 16 is a block diagram of a three-bit SEDL flip-flop in a master-slave arrangement of the SEDL DAC circuit.

FIG. 16 is a block diagram of a three-bit SEDL D flip-flop 1600 in a master-slave arrangement. Similar to the concept shown and described herein regarding FIG. 9, the SEDL device for the DAC circuit can be arranged in a master-slave configuration as shown in FIG. 16.

The three-bit master-slave SEDL flip-flop 1600 includes a master SEDL circuit 1200a coupled to a slave SEDL circuit 1200a', a master SEDL circuit 1510a coupled to a slave SEDL circuit 1510a', and a master SEDL circuit 1520a coupled to a slave SEDL circuit 1520a'. The slave SEDL circuit 1200a' and master SEDL circuit 1200a can be the same as or substantially similar to the circuit 1200 shown. Likewise, the slave SEDL circuit 1510a' and master SEDL circuit 1510a can be the same as or substantially similar to the circuit 1510, and the slave SEDL circuit 1520a' and master SEDL circuit 1520a can be the same as or substantially similar to the circuit 1520 shown in FIG. 15.

In operation, a plurality of data signals (here designated as a Datain(0), Datain(1), Datain(2) are provided to respective ones of data inputs 1601a, 1601b, 1601c (generally denoted 1601 in FIG. 16a) of the three bit mater slave SEDL flip-flop circuit 1600.

In response to the input signals Datain(0), Datain(1), Datain(2) provided thereto, the master SEDL circuits 1200a, 1510a, 1520a process the respective ones of the input signals provided thereto in the manner described herein above in conjunction with FIGS. 12 and 12A. Master SEDL circuits 1200a 1510a, 1520a provide respective ones of master data output signals masterdataout(0), masterdataout (1), masterdataout(2) at respective outputs thereof. The master SEDL output signals are provided at terminals 1603a-1603c (generally denoted 1603 in FIG. 16a). Master SEDL output signals are also provided to inputs of respective ones of slave SEDL circuits 1200a', 1510a', 1520a'.

Figure 16A:
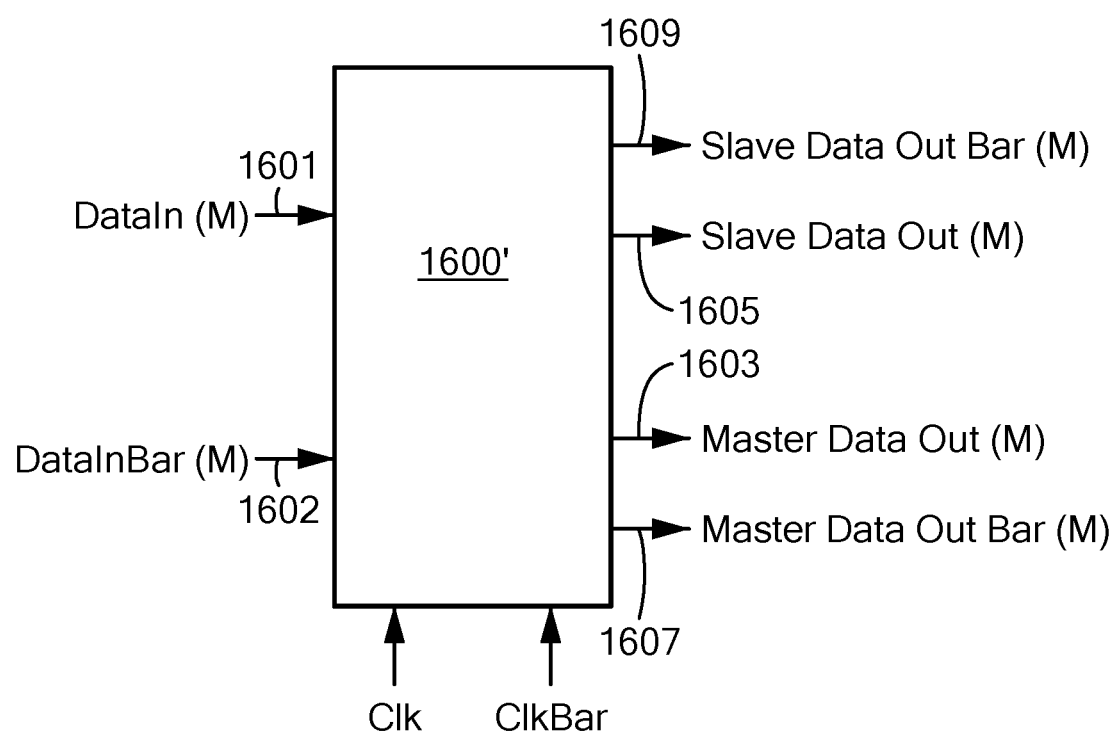
FIG. 16A is a simplified symbol to illustrate the three-bit master-slave flip-flop.

In response to the master signals masterdataout(0), masterdataout(1), masterdataout(2) signals provided thereto, the slave SEDL circuits 1200a', 1510a', 1520a' process the signals in a manner as described above in conjunction with FIGS. 12 and 12A to provide respective ones of slave output signals slavedataout(0), slavedataout(1), slavedataout(2) at master-slave SEDL flip-flop outputs 1605a, 1605b, 1605c. Thus, master slave SEDL flip-flop 1600 is configured to receive an input signal having a plurality of bit (with the input signal corresponding to a three bit input signal in the example of FIGS. 16, 16a) and produce a plurality of output signals (with the output signals corresponding to six output signals i.e., MasterDataOut(0), (1), (2) and SlaveDataOut (0), (1), (2) signals in this example). Due to the fact that the output of the SEDL DAC circuit is a return-to-zero type of signal, it is desirable to arrange the circuit in the master-slave arrangement so that the master and slave data can be combined according to the techniques herein to achieve a non-return-to-zero (NRZ) output FIG. 16A is a simplified symbol to illustrate a multi-bit three-bit master-slave flip-flop circuit 1600' of FIG. 16. Thus, with M=3, symbol 1600' represents the three-bit master-slave flip-flops of FIG. 16.

As shown in FIG. 16, by providing three bits of input data (bit0), (bit1), and (bit2), to circuit 1600 results in three slave data outputs and three master data outputs. The input is the standard three-bit digital input, and the output of the three-bit master-slave flip-flop circuit 1600 is a scaled SEDL pulse data, as will be appreciated in light of the present disclosure. Note that FIG. 16A includes both the three bit data inputs, as well as their complementary data bar inputs, for a total of 6 inputs shown. Likewise, each output has its complementary bar signal shown for a total of 12 outputs.

Referring now to FIG. 17 in which like elements of FIG. 16 are provided having like reference designations, a SEDL DAC comprises a three bit master-slave SEDL DAC flip-flop 1600 having first and second three bit master slave SEDL DAC flip-flops 1710, 1712, coupled to respective ones of outputs thereof. The three-bit master-slave SEDL DAC flip-flop 1600 provides three slave SEDL data bits and three master SEDL data bits at the output of the circuit 1600. The three bits for the master scaled SEDL data are provided to the three-bit master SEDL DAC flop-flop 1710, and the three bits for the slave scaled SEDL data are provided to the three-bit slave SEDL DAC flip-flop 1712. The SEDL DAC 1712 provides SOutX, SOutBarX, SOut, and SOutBarX outputs, and SEDL DAC 1710 provides MOutX, MOutBar, MOut, and MOutBarX outputs. The outputs of the master and slave SEDL DAC flip-flops are provided to a combiner circuit 1720. The combiner circuit 1720 is coupled to the output of the pulse generators and configured to combine outputs provided thereto the pulse generator and determine analog values corresponding to the input pulses. Combiner circuit 1720 is responsive to SEDL pulses provides thereto. The MOut and SOut values are combined. Also the MOutBarX values and the SOutBarX values are combined. The two sets of combined values are then subtracted from each other to provide NRZOut and NRZOutBar output values. This arrangement takes 3 digital SEDL bits in (as shown in FIGS. 18A, 18B, and 18C) and converts them into 8 distinct voltage levels (as shown in FIG. 18D).

The outputs MOut, SOut, MOutBarX, and SOutBarX are return-to-zero (RZ) signals, which return to zero. To achieve a non-return-to-zero (NRZ) output that can identify an analog value, combining the return-to-zero outputs together provides a non-return-to-zero output. The signals input to the DAC and output by the DAC are shown in FIGS. 18-18E.

Figure 18E:
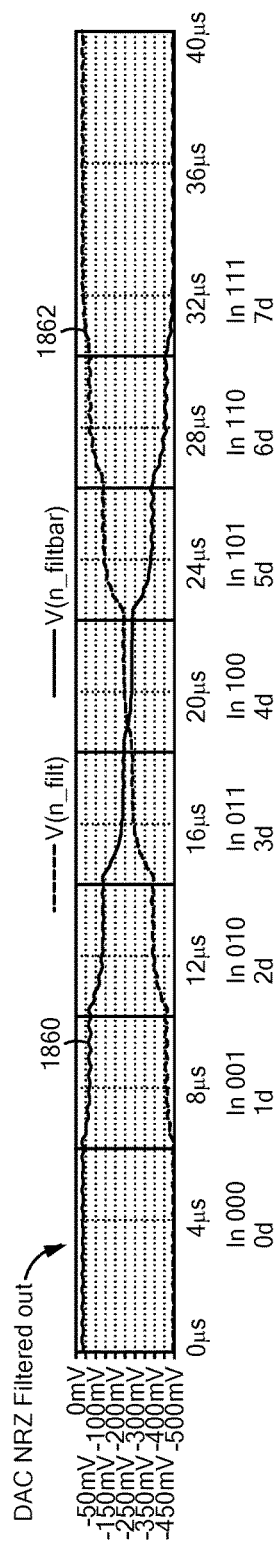
FIG. 18E is a plot of voltage vs. time showing a filtered DAC NRZ output.

FIGS. 18-18E illustrate various input signals and NRZ output analog values provided by the DAC circuit.

FIG. 18 is a graph showing the clock signal of the SEDL DAC circuit. This is the clock signal 'Clk' input to each of the pulse generators for the SEDL DAC circuit.

FIG. 18A is a graph of the DAC bit0 (first bit) of the input signal. The input to the DAC bit0 is shown as V(q0) signal 1820 and V(q0bar) signal 1822.

FIG. 18B is a graph of the DAC bit1 (second bit) of the input signal. The input to the DAC bit1 is shown as V(q1) signal 1830 and V(q1bar) signal 1832.

FIG. 18C is a graph of the DAC bit2 (third bit) of the input signal. The input to the DAC bit2 is shown as V(q2) signal 1840 and V(q2bar) signal 1842.

FIG. 18D is a graph showing the DAC NRZ output. The DAC NRZ output 1850 and complementary DAC NRZ output V(nrz_dacbar) 1852 are shown in the graph of FIG. 18D.

FIG. 18E is a graph showing the filtered DAC NRZ output. A filter may be applied to the DAC NRZ output to provide a DAC NRZ filtered output signal 1860 and the complementary signal 1862.

As shown in FIGS. 18-18E, each three-bit digital value 000, 001, 010, 011, 100, 101, 110, and 111 can be represented by a corresponding analog value 0d, 1d, 2d, 3d, 4d, 5d, 6d, 7d, respectively, with 0d representing a digital value of '0', 1d representing a digital value of '1', 2d representing a digital value of '2', 3d representing a digital value of '3', 4d representing a digital value of '4', 5d representing a digital value of '5', 6d representing a digital value of '6', and 7d representing a digital value of 7'. By providing a different scaled output by each of the clocked comparators for each bit, a different value is provided by each clocked comparator circuit to identify the bit as being the first bit, second bit, or third bit. By combining each bit as a logic '0' or a logic '1' the corresponding analog value can be output, with a different analog value for each different three-bit input digital value. For example, the first bit (bit0) can be ±0.5 Volts, the second bit (bit1) can be ±1 Volt, and the third bit (bit2) can be ±2 Volts. Thus, 001 would be 0.5 volts, a digital value of 010 would be 1 Volt, a digital value of 011 would be 1.5 Volts, a digital value of 100 would be 2.0 Volts, a digital value of 101 would be 2.5 Volts, a digital value of 110 would be 3.0 Volts, and a digital value of 111 would be 3.5 Volts. As such, an output analog value of 3.5 Volts indicates a three-bit digital value of 111, as will be appreciated. The differential levels output by the DAC circuit are proportional to the bit count.

Figure 19:
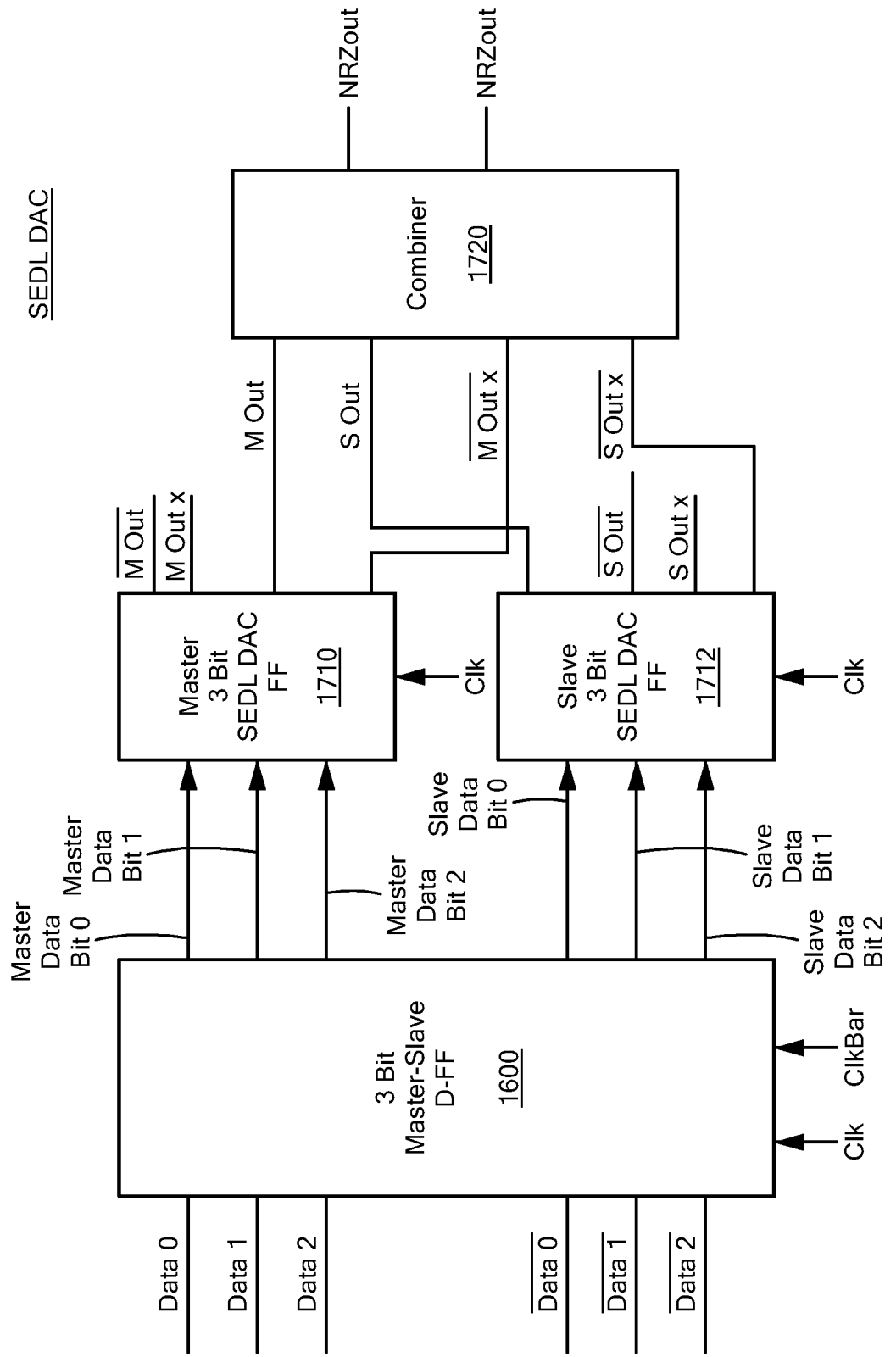
FIG. 19 is a block diagram of a SEDL DAC circuit.

FIG. 19 showing the overall system including the clocked comparator circuits, and the master-slave three-bit DAC circuit 1600.

Referring now to FIG. 19, a SEDL DAC circuit configured to receive a digital three-bit value and output an analog value includes the three-bit master-slave D flip-flop 1600, a master three-bit SEDL DAC flip-flop 1710, a slave three-bit SEDL DAC flip-flop 1712, and a combiner 1720 as shown and described herein. The three-bit master-slave D flip-flop 1600 receives three bits of data as SEDL pulses, as data0, data1, data2, and their complementary pulses databar0, databar1, databar2. These are shown as inputs 1820, 1830, and 1840, with their complementary inputs 1822, 1832, and 1842 in FIG. 18.

The data inputs data0, data1, data2, databar0, databar1, databar2 are fed into the three-bit master-slave D flip-flop 1600 (see, e.g., FIG. 16 detailing the three-bit master-slave D flip-flop). The three-bit master-slave D flip-flop 1600 provides three scaled slave data outputs which are fed into the slave three-bit SEDL DAC flip-flop 1712, and three scaled master data outputs which are fed into the master three-bit SEDL DAC flip-flop 1710. Refer, for example, to FIG. 17 showing the details of the master and slave SEDL DAC flip-flops 1710, 1712). The master out "MOut" output and Master Out Bar X "MOutBarX" output from the three-bit master SEDL DAC flip-flop 1710 are provided to the combiner 1720, and the slave out "SOut" output and Slave Out Bar X "SOutBarX" output from the three-bit slave SEDL DAC flip-flop 1712 are provided to the combiner 1720. The combiner 1720 is then able to provide the NRZ out and NRZ out bar outputs to provide the analog value at an output thereof.

The SEDL techniques of the present disclosure are likewise applicable, for example, to an analog-to-digital converter (ADC). FIGS. 20-21 show an example ADC circuit that receives an analog input value and outputs a SEDL pulse indicative of a digital value, with FIG. 22 showing a graph representing the analog input and the various digital outputs.

FIG. 20 is a block diagram of a portion of a SEDL ADC circuit including a plurality of comparators and an encoder.

In this illustrative embodiment the SEDL ADC includes eight comparators (with only three comparators with each comparators having an output being explicitly shown in FIG. 20) coupled to a corresponding input of an encoder 2030. Thus, in this example, encoder 2030 is an eight input to 3 bit output encoder. The ADC circuit receives an input signal 2010 at a plurality of resistor dividers (resistors 7*R through to 0*R). Each resistor divider has a different such hat a position of the input signal voltage is provided to input of each comparators. A second input of each comparators is coupled to a reference voltage $V_{REF1}$-$V_{REF8}$. The value of the voltage selected varies with application. $V_{REF1}$, $V_{REF2}$ are typically all the same value in this arrangement, however they can vary in other arrangements.

The ADC circuit includes a plurality of comparators with only three comparators a first comparator 2020, a seventh comparator 2022, and an eighth comparator 2024. Second, third, fourth, fifth, and sixth comparators are not shown in the figure, but it will be appreciated that eight total comparators are provided in this example. Also, although only eight comparators are shown, it will be appreciated that the techniques can be scaled to any number of comparators with correspondingly sized encoder. For example, for a four-bit input signal there would be sixteen total comparators and a sixteen-to-four encoder could be used.

The comparators are each configured to receive an analog input signal and to compare the analog input signal to a predetermined reference signal to identify a value of the input signal. In response to the analog input signal being greater than the reference signal, the comparator provides an output having a first value, and in response to the analog input signal being less than the reference signal, the comparator provides an output having a second different value. The output of each comparator is provided to an encoder 2030, which may be an eight-input-to-three-output encoder.

The encoder is configured to receive the output signal from each comparator and in response thereto, to provide at least one of a plurality of bits at an output as a digital value depending upon one of the plurality of values input to the encoder.

Figure 21A:
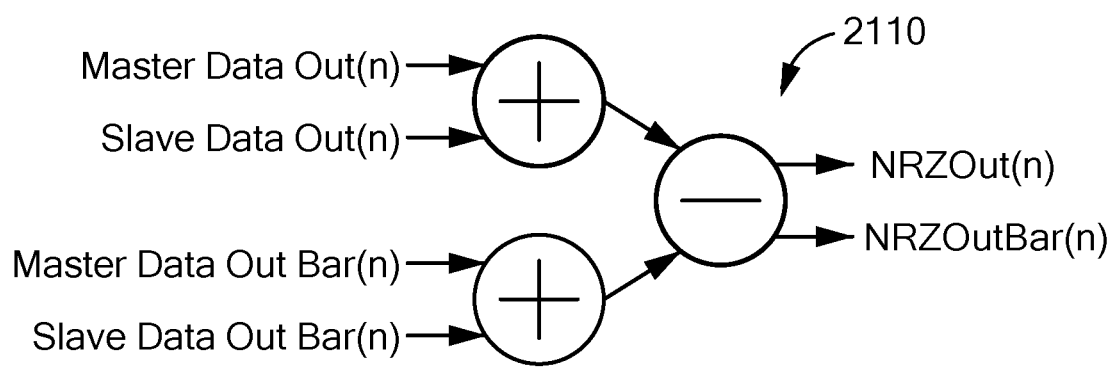
FIG. 21A is a block diagram of a combiner of a SEDL ADC.

In this example, the value of the input signal corresponds to one of at least eight distinct analog values, and the output signal comprises at least three bits, and the encoder comprises an eight-input-to-three-output encoder. The output of the encoder is provided to a spectrally-efficient circuit as shown in FIG. 21. A spectrally-efficient based circuit is configured to assess a state of the digital value and to provide an output pulse having a spectrally-efficient shaped pulse FIG. 21 is a block diagram of another portion of the SEDL ADC that is coupled to receive and be responsive to the data output by a encoder. Such as the encoder described above in conjunction with FIG. 20. The spectrally-efficient circuit 2100 shown in FIG. 21 receives the bit value an encoder (in this example a three-bit encoder) and provides slave data bits and one or more master data bits (in this example, circuit 2100 provides three slave output data bits and three master output data bits). Each master data "Master Data Out" output is combined with the slave data "Slave Data Out" output and subtracted from the "Master Data Out Bar" output combined with the "Slave Data Out Bar" output by the combiner 2110 shown in FIG. 21A to provide the "NRZ out" and "NRZ out bar" outputs. The NRZ out and NRZ out bar outputs for each bit are shown in FIG. 22, with a different NRZ output for each bit. The circuit 2100 can be the same as or substantially similar to the circuit 1600 shown in FIG. 16 herein. The circuit 1600 is used to feed the DAC Flip-Flops 1710, 1712 in a master-slave arrangement. The DAC Flip-Flops 1710, and 1712 generate the scaled SEDL pulses which output scaled SEDL pulses are combined in the master-slave arrangement as shown in FIG. 17A to arrive at an analog output signal having one of eight predetermined voltage levels associated with one of eight analog values. The circuit 2100 is used to generate the SEDL pulses that are output by the ADC as digital values represented by SEDL pulses.

It will be appreciated that there is one combiner for each set of master/slave data outputs. The combiner 2110 receives the master data out for the first bit and the slave data out for the first bit. A second combiner (not shown) can receive the master data out for the second bit and the slave data out of the second bit. A third combiner (not shown) can receive the master data out for the third bit and the slave data out of the third bit. Each NRZ output provides a digital data for each bit of the incoming input signal.

The analog input and corresponding NRZ outputs are shown in FIGS. 22-22C. FIG. 22 is a graph showing the NRZ bit0 output of the SEDL ADC circuit, FIG. 22A is a graph showing the NRZ bit1 output of the SEDL ADC circuit, FIG. 22B is a graph showing the NRZ bit2 output of the SEDL ADC circuit, and FIG. 22C is a graph showing the corresponding analog input signal for the SEDL ADC circuit. As shown, the analog input value of 0 corresponds to an output of 000, with the NRZ0 having a value of zero at 2222 (with the output bar shown at 2220), the NRZ1 having a value of zero at 2232 (with the output bar shown at 2230), and the NRZ2 having a value of zero at 2242 (with the output bar shown at 2240). Likewise, the analog input value of 1 corresponds to the digital value of 001, input value of 2 corresponds to the digital value of 010, input value of 3 corresponds to the digital value of 011, input value of 4 corresponds to the digital value of 100, input value of 5 corresponds to digital value of 101, input value of 6 corresponds to digital value of 110, and input value of 7 corresponds to digital value of 111. The ADC NRZ output is a differential bit count proportional to the analog input signal.

Having described preferred embodiments which serve to illustrate various concepts, structures and techniques which are the subject of this patent, it will now become apparent to those of ordinary skill in the art that other embodiments incorporating these concepts, structures and techniques may be used. Accordingly, it is submitted that that scope of the patent should not be limited to the described embodiments but rather should be limited only by the spirit and scope of the following claims.

All publications and references cited herein are expressly incorporated herein by reference in their entirety.

What is claimed is:

1. A digital-to-analog converter (DAC) circuit comprising:
an integrator circuit having an input configured to receive an input signal provided from a plurality of spectrally-efficient shaped digital logic (SEDL) input pulses, with each input pulse representing one or more bits of the input signal and wherein the integrator circuit is configured to determine a logic state represented by each of the plurality of input pulses;
a first clocked comparator circuit having a first input coupled to the integrator circuit and a second input coupled to receive a clock signal, the first clocked comparator circuit configured to receive the logic state of a first input pulse of the plurality of input pulses and in response thereto, to provide a first scaled SEDL pulse for the first input pulse at an output thereof, the first clocked comparator circuit comprising:

a pulse generator having an input coupled to receive the clock signal and, in response thereto, configured to generate pulses of a fixed amplitude at an output thereof, the fixed amplitude pulses used to generate the first scaled SEDL pulse;

a combiner circuit coupled to the output of the clocked comparator circuit and configured to combine the output provided thereto from the clocked comparator circuit and determine analog values corresponding to the plurality of input pulses.

2. The DAC of claim 1, wherein a first amplitude of the first scaled SEDL pulse is set by a first gain circuit, a first offset current source, and a first signal current source of the first clocked comparator circuit.

3. The DAC of claim 2, wherein the first gain circuit comprises at least two resistors, the first offset current source comprises a third resistor, and the first signal current source comprises a fourth resistor.

4. The DAC of claim 3, wherein the at least two resistors have a same first value, wherein the third resistor has a third value, different from the first value, and wherein the fourth resistor has a fourth value, different from the first and third values.

5. The DAC of claim 2, further comprising a second clocked comparator circuit having first input coupled to the output of the integrator circuit and a second input coupled to receive the clock signal, wherein, in response to receiving a logic state of a second input pulse of the plurality of input pulses, the second pulse generator generates a second scaled SEDL pulse representative of the second input pulse, wherein a second amplitude of the second scaled SEDL pulse is set by a second gain circuit, a second offset current source, and a second signal current source of the second clocked comparator circuit, the second amplitude being different than the first amplitude.

6. The DAC of claim 5, further comprising a third clocked comparator circuit having a first input coupled to the output of the integrator circuit and a second input coupled to receive the clock signal, wherein, in response to receiving a logic state of a third input pulse of the plurality of input pulses, the third pulse generator generates a third scaled SEDL pulse representative of the third input pulse, wherein a third amplitude of the third scaled SEDL pulse is set by a third gain circuit, a third offset current source, and a third signal current source of the third clocked comparator circuit, the third amplitude being different than the first amplitude and the second amplitude.

7. The DAC of claim 6, wherein the output of the first, second, and third clocked comparator circuits are summed together to provide one of eight possible values for an analog signal value that correspond to the logic state of the input signal having at least three bits to provide eight corresponding analog values.

8. The DAC of claim 6, wherein the integrator circuit is configured to integrate the first input pulse over a first portion of a clock period and the first scaled SEDL pulse is output by the first clocked comparator circuit over a second portion of the clock period.

9. The DAC of claim 6, wherein the integrator circuit is configured to integrate the first input pulse, the second input pulse, and the third input pulse over a first portion of the clock period, and the first, second, and third scaled SEDL pulses are output by the first, second, and third scaled comparator circuits during a second portion of the clock period.

10. A digital-to-analog converter (DAC) circuit comprising:

an integrator circuit configured to determine a logic state of at least three bits of an input signal, the input signal having a plurality of spectrally-efficient shaped pulses;

a first clocked comparator circuit configured to receive the logic state of at least a first input pulse of the input signal and configured to generate a first scaled spectrally-efficient pulse, the first clocked comparator comprising a first pulse generator having an input coupled to receive a clock signal and, in response thereto, to generate first pulses of a fixed amplitude at an output thereof, the first fixed amplitude pulses used to generate the first scaled spectrally-efficient pulse;

a second clocked comparator circuit configured to receive the logic state of at least a second input pulse of the input signal and configured to generate a second scaled spectrally-efficient pulse, the second clocked comparator comprising a second pulse generator having an input coupled to receive the clock signal and, in response thereto, to generate second pulses of a fixed amplitude at an output thereof, the second fixed amplitude pulses used to generate the second scaled spectrally-efficient pulse;

a third clocked comparator circuit configured to receive the logic state of at least a third input pulse of the input signal and configured to generate a third scaled spectrally-efficient pulse, the third clocked comparator comprising a third pulse generator having an input coupled to receive the clock signal and, in response thereto, to generate third pulses of a fixed amplitude at an output thereof, the third fixed amplitude pulses used to generate the third scaled spectrally-efficient pulse; and a spectrally-efficient circuit coupled to the output of the first, second and third clocked comparator circuits, configured to combine the output of the first, second, and third clocked comparator circuits to determine an analog value to which the three input pulses correspond.

11. The DAC of claim 10, wherein the amplitude of the first scaled spectrally-efficient shaped pulse is set by a first gain circuit, an offset current source, and a signal current source of the first clocked comparator circuit.

12. The DAC of claim 11, wherein the first gain circuit comprises at least two resistors, the offset current source comprises a third resistor, and the signal current source comprises a fourth resistor.

13. The DAC of claim 10, wherein the first, second and third input pulses are integrated over a first portion of a clock period, and the first, second and third scaled spectrally-efficient shaped pulses are output over a second portion of the clock period.

* * * * *